(12) United States Patent
Usami

(10) Patent No.: US 10,855,147 B2
(45) Date of Patent: Dec. 1, 2020

(54) DRIVE UNIT, ELECTRICALLY ASSISTED VEHICLE HAVING THE DRIVE UNIT, AND METHOD OF ASSEMBLING THE DRIVE UNIT

(71) Applicant: YAMAHA HATSUDOKI KABUSHIKI KAISHA, Iwata (JP)

(72) Inventor: Tomohiro Usami, Shizuoka (JP)

(73) Assignee: YAMAHA HATSUDOKI KABUSHIKI KAISHA, Shizuoka (JP)

( * ) Notice: Subject to any disclaimer, the term of this patent is extended or adjusted under 35 U.S.C. 154(b) by 275 days.

(21) Appl. No.: 16/058,020

(22) Filed: Aug. 8, 2018

(65) Prior Publication Data

US 2019/0052153 A1 Feb. 14, 2019

(30) Foreign Application Priority Data

Aug. 9, 2017 (JP) .................................. 2017-154822

(51) Int. Cl.
| B62M 6/45 | (2010.01) |
| H02K 11/33 | (2016.01) |
| B62M 6/55 | (2010.01) |
| H05K 5/00 | (2006.01) |
| H05K 5/02 | (2006.01) |

(52) U.S. Cl.
CPC .............. *H02K 11/33* (2016.01); *B62M 6/45* (2013.01); *B62M 6/55* (2013.01); *H05K 5/006* (2013.01); *H05K 5/0247* (2013.01); *H02K 2211/03* (2013.01)

(58) Field of Classification Search
CPC ...... H02K 11/33; H02K 2211/03; B62M 6/45; B62M 6/55; H05K 5/006; H05K 5/0247
See application file for complete search history.

(56) References Cited

U.S. PATENT DOCUMENTS

| 5,956,996 A | 9/1999 | Nara et al. |
| 8,657,047 B2 * | 2/2014 | Urabe ..................... B60L 58/12 |
| | | 180/65.51 |
| 2007/0155580 A1 | 7/2007 | Nichols et al. |
| 2010/0243349 A1 | 9/2010 | Nomura et al. |
| 2011/0073363 A1 | 3/2011 | Nagao et al. |
| 2011/0303471 A1 | 12/2011 | Urabe et al. |

(Continued)

FOREIGN PATENT DOCUMENTS

| CN | 102036527 A | 4/2011 |
| CN | 102275626 A | 12/2011 |

(Continued)

*Primary Examiner* — Kevin Hurley
*Assistant Examiner* — Marlon A Arce
(74) *Attorney, Agent, or Firm* — Keating and Bennett, LLP

(57) ABSTRACT

A drive unit for an electrically assisted vehicle includes an electric motor, an electronic circuit board including a control circuit that controls rotation of the electric motor, a holder that covers an entirety or a portion of the electronic circuit board and is fixed to the electronic circuit board, and a housing that accommodates the electric motor, the electronic circuit board, and the holder, such that the electronic circuit board is at a deeper position than the holder. A position of the holder on the electronic circuit board is fixed by tabs. The holder and the electronic circuit board are fixed to the housing by fasteners extending through first holes in the electronic circuit board and second holes in the holder.

15 Claims, 18 Drawing Sheets

(56) References Cited

U.S. PATENT DOCUMENTS

| | | | | |
|---|---|---|---|---|
| 2012/0161495 A1* | 6/2012 | Ito | ............................ | B60L 50/20 |
| | | | | 301/6.5 |
| 2013/0145885 A1* | 6/2013 | Kitamura | ............... | B62M 25/08 |
| | | | | 74/473.12 |

FOREIGN PATENT DOCUMENTS

| | | | |
|---|---|---|---|
| CN | 104925209 | A | 9/2015 |
| EP | 2 394 903 | A1 | 12/2011 |
| EP | 2 783 972 | A1 | 10/2014 |
| EP | 2 957 495 | A1 | 12/2015 |
| JP | 09-226664 | A | 9/1997 |
| JP | 2003-164104 | A | 6/2003 |
| JP | 2014-196074 | A | 10/2014 |
| TW | 355731 | B | 4/1999 |
| TW | I418474 | B | 12/2013 |
| TW | I461616 | B | 11/2014 |
| WO | 2014/125817 | A1 | 8/2014 |
| WO | 2016/067199 | A1 | 5/2016 |

\* cited by examiner

DRIVE UNIT, ELECTRICALLY ASSISTED VEHICLE HAVING THE DRIVE UNIT, AND METHOD OF ASSEMBLING THE DRIVE UNIT

CROSS REFERENCE TO RELATED APPLICATIONS

This application claims the benefit of priority to Japanese Patent Application No. 2017-154822 filed on Aug. 9, 2017. The entire contents of this application are hereby incorporated herein by reference.

BACKGROUND OF THE INVENTION

1. Field of the Invention

The present invention relates to a drive unit including an electric motor, an electrically assisted vehicle including the drive unit, and a method of assembling the drive unit.

2. Description of the Related Art

One known example of an electrically assisted vehicle which utilizes an electric motor to provide assistance for human force is an electrically assisted bicycle (see, for example, Japanese Laid-Open Patent Publication No. 09-226664). In an electrically assisted bicycle, the electric motor generates a driving power which is in accordance with the human force that a rider applies to the pedals, such that the rider's burden when going up an ascent, or carrying luggage, can be reduced.

The electric motor is housed in a power unit (drive unit). In addition to the electric motor, the drive unit includes a control circuit that controls the electric motor, an electronic circuit board on which a power circuit and the like are mounted, and so on.

Since the drive unit is composed of a multitude of mechanical parts and electronic circuit parts, it needs to be assembled with an increased efficiency.

SUMMARY OF THE INVENTION

Preferred embodiments of the present invention provide an improved workability in a step of assembling circuit boards in drive units for electrically assisted vehicles, and reduce any failures that might occur after the assembly.

According to a preferred embodiment of the present invention, a drive unit for an electrically assisted vehicle includes an electric motor; an electronic circuit board having mounted thereon a control circuit that controls rotation of the electric motor; a holder that covers an entirety or a portion of the electronic circuit board and is fixed to the electronic circuit board; and a housing that accommodates the electric motor, the electronic circuit board, and the holder, such that the electronic circuit board is accommodated at a deeper position than the holder, wherein, the electronic circuit board includes a first hole; the holder includes a second hole and at least two tabs; the holder is fixed to the electronic circuit board by using the at least two tabs; and the electronic circuit board and the holder are fixed to the housing by a fastener extending through the first hole and the second hole.

Providing a holder which is fixed to an electronic circuit board by using at least two tabs allows for easy positioning using a fastener during a mounting task onto the housing, and protects the electronic circuit board after mounting.

According to a preferred embodiment of the present invention, when the holder is fixed to the electronic circuit board by the at least two tabs, the first hole and the second hole oppose each other. Since the first hole in the electronic circuit board and the second hole in the holder oppose each other, the position of the first hole in the circuit board is easily determined during the mounting task onto the housing. Since the electronic circuit board is protected by the holder, when the fastener is passed through the first hole in the circuit board, the possibility for a tool being used to mistakenly contact the electronic circuit parts, wiring lines, etc., on the electronic circuit board is greatly reduced.

According to a preferred embodiment of the present invention, the housing includes a third hole; wherein when the holder is fixed to the electronic circuit board by the at least two tabs and the holder and the electronic circuit board are inserted in the housing, the first hole and the third hole oppose each other; and the electronic circuit board is fixed to the housing as a result of the fastener passing through the first hole and into the third hole. Since the first hole in the circuit board and the third hole in the housing oppose each other, the position of the first hole in the circuit board is easily determined during the mounting task onto the housing.

According to a preferred embodiment of the present invention, the fastener is preferably a screw, for example; and the third hole is preferably a female screw hole, for example. The first hole in the circuit board opposes the second hole in the holder, and also the third hole in the housing. This allows for a very easy positioning during insertion of the screw.

According to a preferred embodiment of the present invention, the second hole in the holder is a recess extending along an outer periphery of the holder; and when the holder is fixed to the electronic circuit board by the at least two tabs, a predetermined space is provided between the first hole and the outer periphery where the recess is located. In the recessed portion of the holder, the electronic circuit board and the housing may be fixed by a fastener, e.g., a screw.

According to a preferred embodiment of the present invention, the predetermined space is wider than a space that is likely to cause interference between the recess and a head of the screw.

According to a preferred embodiment of the present invention, the second hole in the holder is a screw guide having a tapered shape. The tapered shape allows the screw to be guided so as to maintain an erect posture, thus making it less likely for the screw to drop. The tapered shape also makes it less likely for the tool being used to mistakenly contact the electronic circuit parts, wiring lines, etc., on the electronic circuit board during insertion of the screw.

According to a preferred embodiment of the present invention, the holder covers a region of the electronic circuit board adjacent the first hole. The holder covers regions adjacent the first hole where the holder is fastened to the housing. As a result, the electronic circuit board is prevented from being damaged by the tool or the like.

According to a preferred embodiment of the present invention, the holder further includes an insertion guide in at least one location on the outer periphery; and the insertion guide extends along an inner wall of the housing and in a depth direction of the housing. By providing an insertion guide, the electronic circuit board and the holder are able to be inserted while being guided along the inner wall of the housing during the mounting task onto the housing.

According to a preferred embodiment of the present invention, an outer edge of the electronic circuit board is spaced apart from an inner wall surface of the housing; and the insertion guide is disposed between the outer edge of the electronic circuit board and the inner wall surface of the housing. Since the electronic circuit board is not in contact with the housing, the electronic circuit board and the housing are electrically insulated from each other.

According to a preferred embodiment of the present invention, the electronic circuit board further includes at least one wiring line which is electrically connected to the electric motor; the holder further includes a harness guide in at least one location on the outer periphery; and when the holder is fixed to the electronic circuit board by the at least two tabs and the holder and the electronic circuit board are inserted in the housing, the at least one wiring line is pushed into the housing by the harness guide. Since the wiring line(s) (harness) is pushed into the housing and kept there by the harness guide during mounting onto the housing, the harness is prevented from being caught between the housing and the electronic circuit board.

According to a preferred embodiment of the present invention, the harness guide includes a first guide member and a second guide member which are connected to each other; the first guide member extends along an inner wall of the housing and in a depth direction of the housing; the second guide member is connected to the first guide member at a predetermined position thereof, and extends in a direction which is perpendicular or substantially perpendicular to the depth direction; and with the second guide member, the harness guide keeps the at least one wiring line pushed into the housing. Since the second guide member of the harness guide has a surface extending along directions that are perpendicular or substantially perpendicular to the depth direction of the housing, the wiring line(s) is more reliably pushed into the housing and maintained in this structural arrangement.

According to a preferred embodiment of the present invention, the drive unit further includes a crank shaft, the electronic circuit board and the holder are each C-shaped or substantially C-shaped and surround the crank shaft with the crank shaft located in a center thereof; and the second guide member of the harness guide extends in a direction which is perpendicular or substantially perpendicular to the depth direction of the housing and which extends toward the crank shaft.

According to a preferred embodiment of the present invention, an electrically assisted vehicle includes a plurality of wheels; any one of the drive units described above; and a motive power transmission that transmits a driving power generated by the electric motor of the drive unit to at least one of the plurality of wheels.

According to a preferred embodiment of the present invention, a method of assembling a drive unit for an electrically assisted vehicle includes providing a housing; providing an electronic circuit board having mounted thereon a control circuit that controls rotation of an electric motor that drives the electrically assisted vehicle, the electronic circuit board including a first hole; providing a holder including at least two tabs and a second hole; using the at least two tabs to fix the holder to the electronic circuit board so that the holder covers an entirety or a portion of the electronic circuit board; inserting the electronic circuit board into the housing while pressing on the holder so that the electronic circuit board is accommodated at a deeper position than the holder; and fixing the electronic circuit board and the holder to the housing by passing a fastener through the first hole and the second hole.

After fixing the holder to the electronic circuit board using the at least two tabs, the electronic circuit board is mounted on the housing. This allows easy positioning with the fastener during the mounting task onto the housing. After the electronic circuit board is mounted, the electronic circuit board is protected by the holder.

According to a preferred embodiment of the present invention, a drive unit includes a holder which is fixed in a position on an electronic circuit board using at least two tabs. This allows easy positioning with a fastener such as a screw during the mounting task onto the housing, and protects the electronic circuit board after mounting.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 8 is a diagram showing the structure of an electronic circuit board 200 being retained by a tab 102a.

FIG. 13 is a cross-sectional view of an insertion guide 110a.

DETAILED DESCRIPTION OF THE PREFERRED EMBODIMENTS

Figure 1:
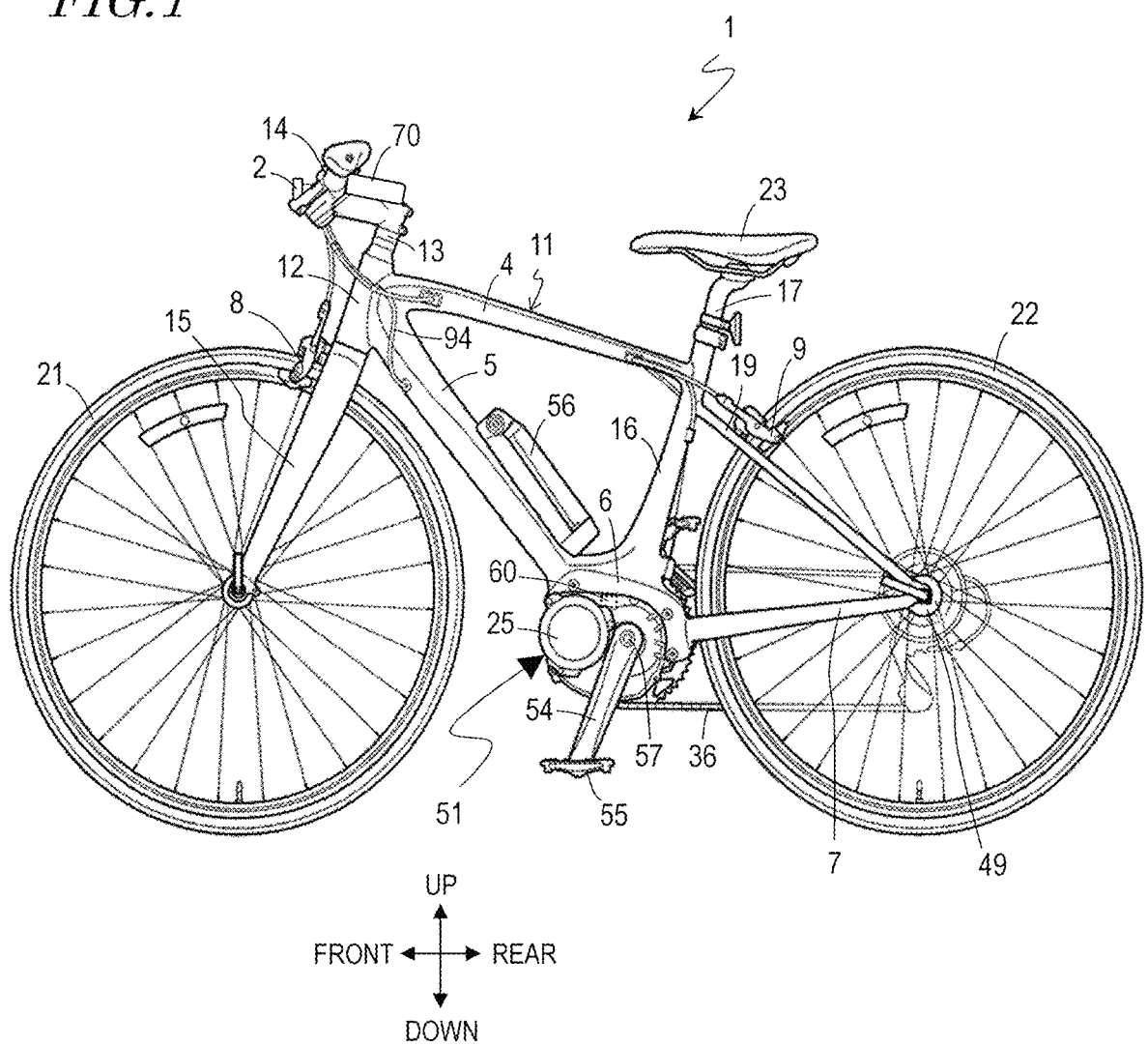
FIG. 1 is a side view showing an electrically assisted bicycle according to an illustrative preferred embodiment of the present invention.

Regarding the procedures of assembling a drive unit, the procedures involved in the task of mounting an electronic circuit board, as has been conventionally practiced, will first be described.

First, the electronic circuit board is temporarily placed on a drive unit housing which is provided in advance, and the positions of screw holes in the electronic circuit board are aligned with the positions of bosses on the housing, in which female screw holes are provided. Thereafter, the electronic circuit board is fastened to the housing by screws. Finally, a holder for protecting the electronic circuit board is attached. Note that, in some cases, the last step of attaching a holder may not exist.

Regarding the above task, fastening the electronic circuit board to the housing with a screw while trying to align the position of the screw hole with the position of a boss can be a difficult task because the reaction force from the harness (es) tends to hinder adjustment of the position of the electronic circuit board. Not only a harness for receiving electric power from the battery, but also a harness(es) for flowing a relatively large electric current to the electric motor, etc., are connected to the electronic circuit board. Since each of the plurality of harnesses is relatively thick in diameter and is stiff, even if a relatively light-weighted electronic circuit board is pressed against the harnesses for temporary placement, the reaction force may move the electronic circuit board backward until the screw hole and the boss on the housing become misplaced. For this reason, a line worker would, while pressing on the electronic circuit board by one hand with an amount of force that counterbalances the reaction force from the harness, try to align the screw hole in the electronic circuit board and the boss on the housing.

Once the alignment is completed, the worker will manipulate a tool with the other hand to fasten the electronic circuit board to the housing with the screw. In doing so, if the worker allows the tool in his or her hand to be misplaced so that the tool bit becomes deviated from the screw head, the bit may then contact the electronic circuit board and damage the electronic circuit board. Accordingly, a jig having a hole correspondingly made in the position of a screw hole of the electronic circuit board would be attached to the electronic circuit board with due alignment, and then the screw would be fastened in this state. Once such a jig is attached, the bit deviating from the screw head, if at all, would be received by the jig, so that the electronic circuit board would not be damaged.

When an electronic circuit board is fastened to the housing with screws, the following problem may further occur. That is, before the worker knows, a harness may become caught between the electronic circuit board and a boss(es) on the housing, and the worker may still to fasten the screw(s) in this state. This may result in a failure, e.g. of damaging the coating on the harness, or even breaking the harness, at the site of assembly.

The inventors of preferred embodiments of the present invention have vigorously sought for solutions to any one or more of the above problems, thus discovering preferred embodiments of the structure described below.

Hereinafter, preferred embodiments of electrically assisted vehicles according to the present invention will be described. An example of an electrically assisted vehicle is an electrically assisted bicycle. In the preferred embodiments of the present invention, any reference to "front/rear", "right/left" and "above(up)/below(down)" is based on a state where a rider is seated on a saddle (seat) of an electrically assisted vehicle so as to face the handle bars. In the drawings, reference numerals F, Re, L, R, U, and D respectively represent front, rear, left, right, up, and down. Note that the following preferred embodiments are illustrative, and the present invention is not limited to the following preferred embodiments.

Note that unnecessarily detailed descriptions may be omitted. For example, detailed descriptions of what is well known in the art or redundant descriptions of what is substantially the same constitution may be omitted. This is to avoid lengthy description, and facilitate the understanding of those skilled in the art. The accompanying drawings and the following description, which are provided by the present inventors so that those skilled in the art can sufficiently understand the present disclosure, are not intended to limit the scope of claims.

FIG. 1 is a side view showing an electrically assisted bicycle 1 according to an illustrative preferred embodiment of the present invention.

The electrically assisted bicycle 1 includes a body frame 11. The body frame 11 includes a head pipe 12, a top tube 4, a down tube 5, a bracket 6, a chain stay 7, a seat tube 16, and a seat stay 19. The head pipe 12 is disposed at the front end of the body frame 11. The handle stem 13 is inserted in the head pipe 12 so as to be rotatable. A handle bar 14 is fixed at an upper portion of the handle stem 13. Front forks 15 are fixed at a lower portion of the handle stem 13. Lower end portions of the front forks 15 support a front wheel 21, defining a steering wheel, so as to be rotatable. A brake 8 to act on the front wheel 21 is provided on the front forks 15. On the handle bar 14, a display device 70 is provided to display various information concerning the electrically assisted bicycle 1. A headlamp 2 is provided forward of the handle stem 13.

The down tube 5 extends obliquely below and rearward from the head pipe 12. The seat tube 16 extends above from a rear end portion of the down tube 5. The chain stay 7 extends rearward from a lower end portion of the seat tube 16. The bracket 6 connects together the rear end portion of the down tube 5, the lower end portion of the seat tube 16, and a front end portion of the chain stay 7. The top tube 4 connects the head pipe 12 with an upper portion of the seat tube 16.

A seat post 17 is inserted in the seat tube 16, and a saddle 23 for a rider to sit on is provided at an upper end portion of the seat post 17. A rear end portion of the chain stay 7 supports a rear wheel 22, which defines a driving wheel, so as to be rotatable. The seat stay 19 extends obliquely below and rearward from an upper portion of the seat tube 16. A lower end portion of the seat stay 19 is connected to the rear portion of the chain stay 7. A brake 9 to act on the rear wheel 22 is provided on the seat stay 19. A speed sensor 49 to detect rotation of the rear wheel 22 is provided at the rear end portion of the chain stay 7.

The drive unit 51 is fixed to the bracket 6, which in itself is located near the vehicle central portion of the body frame 11, with fastening bolts or the like. The drive unit 51 includes an electric motor 25, a crank shaft 57, and a controller 60. A battery 56 to supply electric power to the electric motor 25 and the like is mounted on the down tube 5. The battery 56 may be mounted to the bracket 6 or the seat tube 16. The battery 56 is detachable from the electrically assisted bicycle 1. Charging of the battery 56 is performed by connecting the battery 56 to an external charger (not shown), with the battery 56 being removed from the electrically assisted bicycle 1, for example.

The crank shaft 57 is supported by the drive unit 51 by penetrating therethrough in the right-left direction. Crank arms 54 are provided at both ends of the crank shaft 57. At the leading end of each crank arm 54, a pedal 55 is provided so as to be rotatable.

The controller 60 controls the operation of the electrically assisted bicycle 1. Typically, the controller 60 includes a semiconductor integrated circuit such as a microcontroller, a signal processor, etc., that is able to process digital signals. The controller 60 includes an electronic circuit board 200 (described below) and various electronic circuit elements, e.g., the semiconductor integrated circuit, that are provided on the electronic circuit board 200.

A rotational output of the crank shaft 57 which is generated as the rider steps on the pedals 55 with his or her feet is transmitted to the rear wheel 22 via a chain 36. The controller 60 controls the electric motor 25 so as to generate a drive assisting output which is in accordance with the rotational output of the crank shaft 57. The assistance force which is generated by the electric motor 25 is transmitted to the rear wheel 22 via the chain 36. Instead of the chain 36, a belt, a shaft, or the like may be used.

Figure 2:
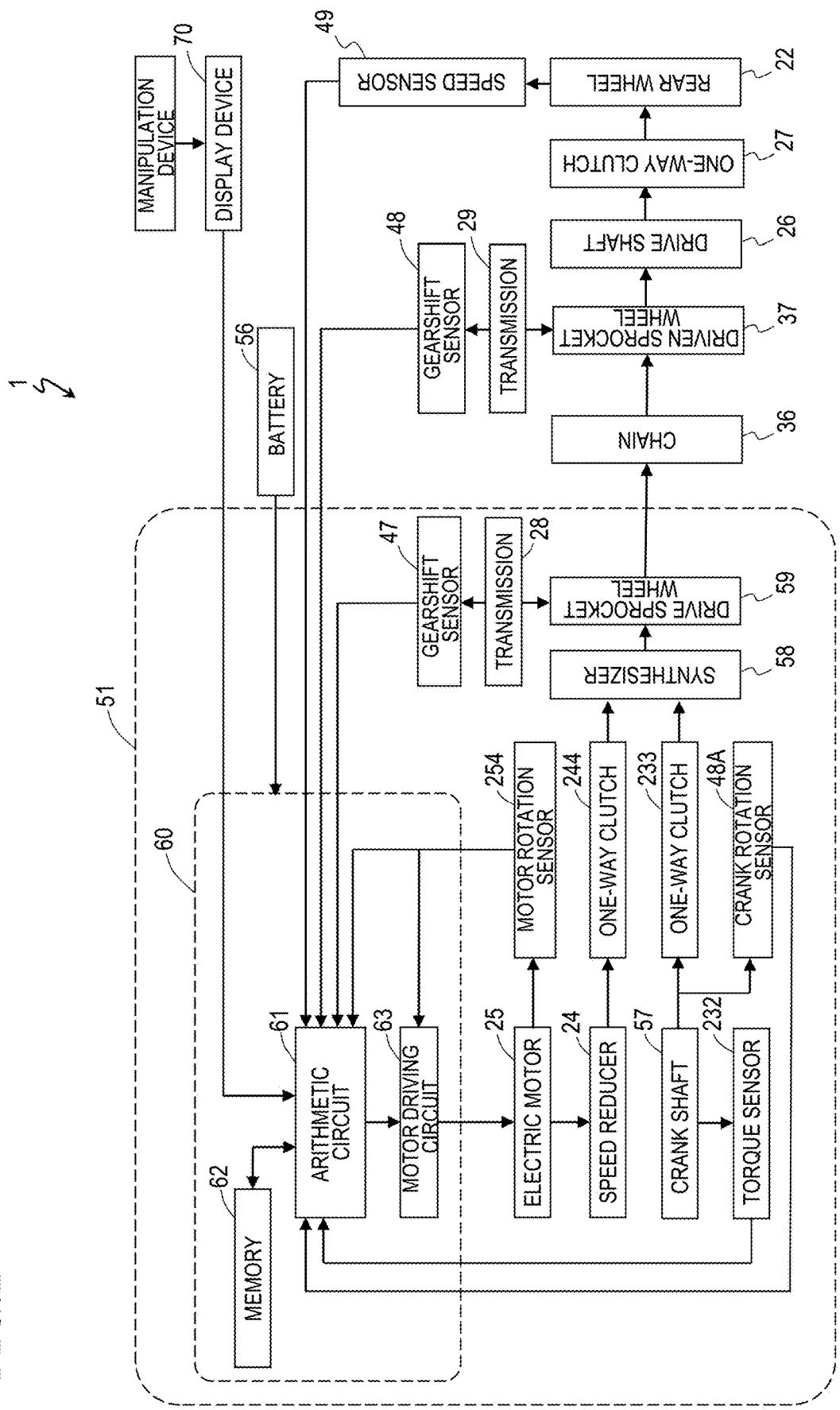
FIG. 2 is a block diagram showing a mechanical and electrical construction of the electrically assisted bicycle.

FIG. 2 is a block diagram showing the mechanical and electrical elements of the electrically assisted bicycle 1. The drive unit 51 includes a transmission 28, a torque sensor 232, a crank rotation sensor 48A, a one-way clutch 233, a one-way clutch 244, a speed reducer 24, a motor rotation sensor 254, a gearshift sensor 47, the electric motor 25, the crank shaft 57, a synthesizer 58, a drive sprocket wheel 59, and the controller 60. The drive unit 51 is an assistance output control system that causes the electric motor 25 to generate a drive assisting output which is in accordance with the human force of a rider as applied to the pedals 55 (FIG. 1).

First, the transmission path of motive power will be described. As the rider steps on the pedals 55 (FIG. 1) to rotate the crank shaft 57, this rotation of the crank shaft 57 is transmitted to the synthesizer 58 via the one-way clutch 233. Via the speed reducer 24 and the one-way clutch 244, rotation of the electric motor 25 is transmitted to the synthesizer 58.

The synthesizer 58 includes a drive sprocket wheel 59 mounted thereto. The synthesizer 58 rotates around the same axis of rotation as the crank shaft 57 and the drive sprocket wheel 59.

The one-way clutch 233 transmits any forward rotation of the crank shaft 57 to the synthesizer 58, while not transmitting any backward rotation of the crank shaft 57 to the synthesizer 58. The one-way clutch 244 transmits to the synthesizer 58 any rotation that is generated by the electric motor 25 in a direction of causing forward rotation of the synthesizer 58, while not transmitting to the synthesizer 58 any rotation occurring in a direction of causing backward rotation of the synthesizer 58. Moreover, while the electric motor 25 is stopped, if the rider has moved the pedals 55 so that the synthesizer 58 rotates, the one-way clutch 244 does not transmit this rotation to the electric motor 25. The pedaling force which the rider has applied to the pedals 55 and the assistance force which has been generated by the electric motor 25 are transmitted to the synthesizer 58, where they are merged. The resultant force as synthesized by the synthesizer 58 is transmitted to the chain 36 via the drive sprocket wheel 59.

Rotation of the chain 36 is transmitted to a drive shaft 26 via a driven sprocket wheel 37. Rotation of the drive shaft 26 is transmitted to the rear wheel 22 via the one-way clutch 27.

In this example, the drive sprocket wheel 59 includes a plurality of sprocket wheels. The transmission 28 alters the gear ratio in response to the rider's manipulation of the gear shifter (not shown). Also, the transmission 29 alters the gear ratio in response to the rider's manipulation of the gear shifter. For example, the transmission 29 may be an external transmission, in which case the driven sprocket wheel 37 includes a plurality of sprocket wheels. Note that the transmission 29 of the electrically assisted bicycle 1 may be an internal transmission, without being limited to an external transmission. Only when the rotational speed of the drive shaft 26 is faster than the rotational speed of the rear wheel 22, the one-way clutch 27 transmits rotation of the drive shaft 26 to the rear wheel 22. When the rotational speed of the drive shaft 26 is slower than the rotational speed of the rear wheel 22, the one-way clutch 27 does not transmit rotation of the drive shaft 26 to the rear wheel 22.

Via the above-described transmission path of motive power, the pedaling force which has been applied by the rider to the pedals 55 and the assistance force which has been generated by the electric motor 25 are transmitted to the rear wheel 22.

Note that the structure by which the pedaling force of the rider and the assistance force generated by the electric motor 25 are merged is not limited to the above-described synthesizer 58, which rotates around the same axis of rotation as the crank shaft 57. The pedaling force and the assistance force may be merged at the chain 36.

In the present specification, the mechanical structure which allows the driving power generated by the electric motor 25 of the drive unit 51 to be transmitted to the rear wheel 22 may be referred to as a "motive power transmission". In FIG. 2, for example, the speed reducer 24, the one-way clutch 244, the synthesizer 58, the drive sprocket wheel 59, the chain 36, the driven sprocket wheel 37, the drive shaft 26, and the one-way clutch 27 may define a motive power transmission. The crank shaft 57 and the one-way clutch 233 may be included in the motive power transmission.

Figure 3:
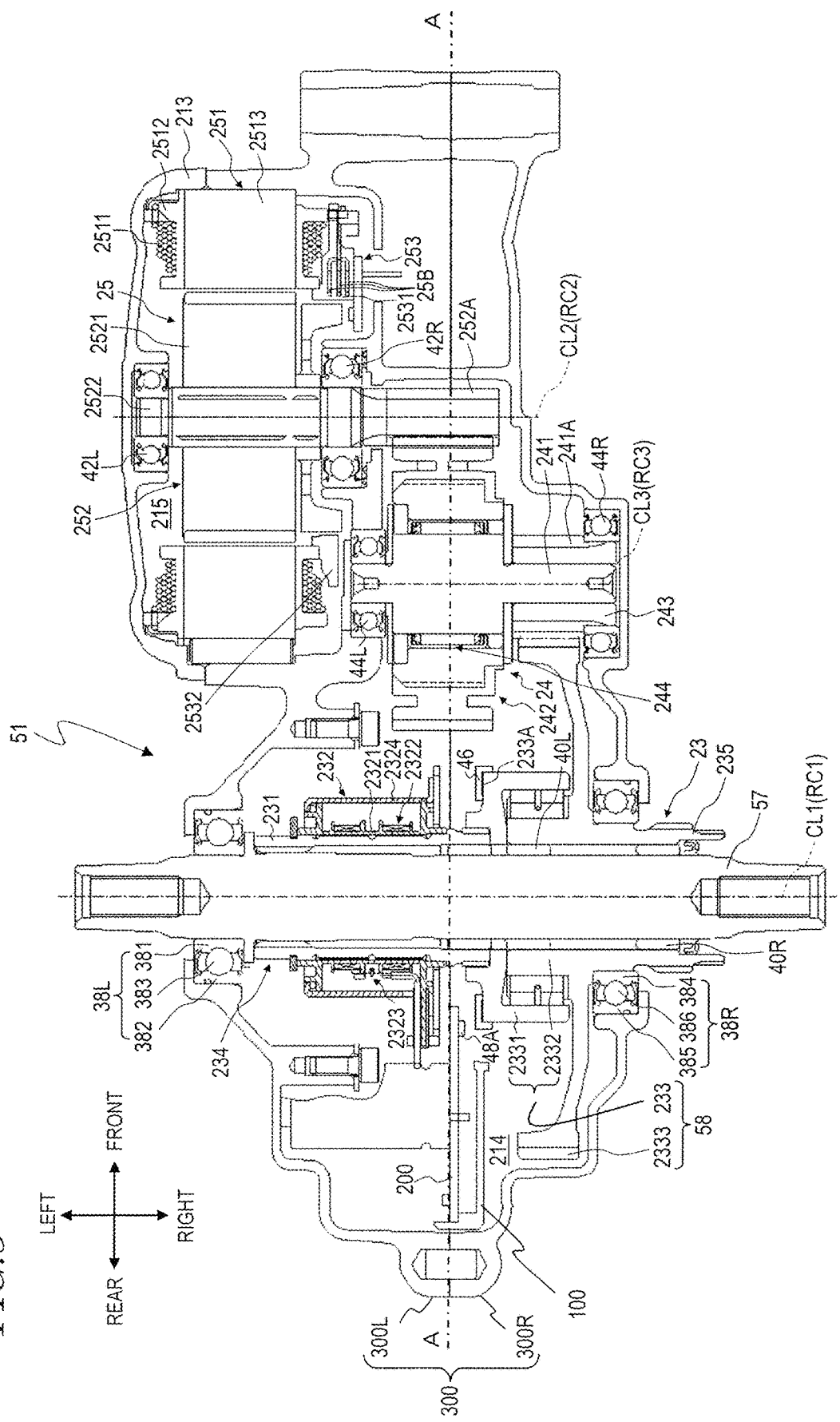
FIG. 3 is a cross-sectional view showing the internal structure of a drive unit 51.

FIG. 3 is a cross-sectional view showing the internal structure of the drive unit 51. FIG. 3 shows a cross section when viewing the drive unit 51 from above (i.e., the U direction). The drive unit 51 includes the electric motor 25, the crank shaft 57, a holder 100, an electronic circuit board 200, and a housing 300. The housing 300 accommodates the above elements.

The housing 300 is split into two portions (i.e., a right housing 300R and a left housing 300L) at line A-A. The right housing 300R and the left housing 300L are fitted together, and fixed by, for example, bolts (not shown).

Hereinafter, the structure illustrated in FIG. 3 will be described.

As shown in FIG. 3, the drive unit 51 includes the housing 300, the crank shaft 57, a rotary shaft 23, the speed reducer 24, and the electric motor 25.

The housing 300 is fixed to the bracket 6 by a plurality of fasteners, for example. The housing 300 includes a left housing 300L, a right housing 300R, and a cover 213. The left housing 300L, the right housing 300R, and the cover 213 are each preferably made of a metal material (e.g., an aluminum alloy).

In terms of the right-left direction, the left housing 300L is overlaid on the right housing 300R from the left. In this state, the left housing 300L is fixed to the right housing 300R by a plurality of fasteners, for example. As a result, a space 214 is created between the left housing 300L and the right housing 300R.

In terms of the right-left direction, the cover 213 is overlaid on the left housing 300L from the left. In this state, the cover 213 is fixed to the left housing 300L by a plurality of fasteners, for example. As a result, on the outside (i.e., the left side) of the left housing 300L, a space 215 that is covered by the cover 213 is created.

The crank shaft 57 extends through the housing 300 along the vehicle's right-left direction. In other words, the center axis CL1 of the crank shaft 57 extends along the right-left direction. As viewed along the axial direction (thrust direction) of the crank shaft 57, the center axis CL1 defines the center of gyration RC1 of the crank shaft 57. The crank shaft 57 rotates with respect to the housing 300 around the center axis CL1.

The crank shaft 57 is rotatably supported by a pair of bearings 38L and 38R within the housing 300. One (38L) of the pair of bearings 38L and 38R (hereinafter referred to as the "first bearing") is disposed at one side along the thrust direction (which herein is the left side). On the other hand, the other (38R) of the pair of bearings 38L and 38R (hereinafter referred to as the "second bearing") is disposed at the other side (which herein is the right side) along the thrust direction.

The first bearing 38L is preferably a roller bearing that includes an inner ring 381, an outer ring 382, and a rolling element 383. The first bearing 38L moves along the thrust direction relative to the crank shaft 57. In the example shown in FIG. 3, the inner ring 381 of the first bearing 38L is press-fitted to the crank shaft 57.

The second bearing 38R is also preferably a roller bearing that includes an inner ring 384, an outer ring 385, and a rolling element 386. The second bearing 38R rotatably supports the crank shaft 57, via a driven member 2332 of a one-way clutch 233 and plain bearings 40L and 40R, which will be described below.

The crank shaft 57 extends through the rotary shaft 23. The rotary shaft 23 is accommodated in the housing 300. Details of the rotary shaft 23 will be described below. The crank shaft 57 includes a pair of right and left crank arms (not shown) mounted thereto. Pedals (not shown) are mounted on the crank arms.

The electric motor 25 is accommodated in the housing 300. The electric motor 25 generates a driving power which assists the travel of the electrically assisted bicycle 10. The electric motor 25 includes a stator 251 and a rotor 252.

The stator 251 includes a plurality of (e.g., fourteen) bobbins 2512, around which coils 2511 are wound. An iron core 2513 is inserted in each bobbin 2512. The stator 251 is disposed in the space 215. In this state, the stator 251 is fixed to the left housing 300L.

A supporting member 253 is mounted on the stator 251. The supporting member 253 is preferably made of a resin material. A plurality of busbars 25B are embedded in the supporting member 253. Each busbar 25B is connected to a corresponding coil 2511. By controlling powering to the busbars 25B, a magnetic force is generated in the stator 251.

The supporting member 253 is preferably an annular-shaped. Along the axial direction of the rotor 252, the supporting member 253 is located closer to the second housing member 212 than the stator 251. The supporting member 253 includes embedded portions 2531 at which the busbars 25B are embedded and non-embedded portions 2532 at which no busbars 25B are embedded.

The rotor 252 is disposed inside the stator 251. The center axis CL2 of the rotor 252 is parallel or substantially parallel to the center axis CL1 of the crank shaft 57. In other words, the rotor 252 is disposed parallel or substantially parallel to the crank shaft 57. As viewed along the axial direction of the crank shaft 57, the center axis CL2 defines the center of gyration RC2 of the rotor 252.

The rotor 252 includes a rotor main body 2521 and an output shaft 2522. These will now be described.

The outer peripheral surface of the rotor main body 2521 is alternately magnetized into N-poles and S-poles along the peripheral direction. In the present preferred embodiment, there are seven N-poles and seven S-poles, for example. The output shaft 2522 extends through the rotor main body 2521. The output shaft 2522 is fixed to the rotor main body 2521. In other words, the output shaft 2522 rotates together with the rotor main body 2521.

By two bearings 42L and 42R, the output shaft 2522 is supported so as to be rotatable relative to the housing 300 around the center axis CL2. The bearing 42L is fixed to the cover 213. The bearing 42R is disposed farther toward the right side (i.e., toward the other end of the axial direction) than the rotor main body 2521, and is fixed to the left housing 300L.

The output shaft 2522 extends through the left housing 300L. In a portion of the output shaft 2522 that is located in the space 214, an output gear 252A is provided. The output gear 252A is preferably a helical gear.

The speed reducer 24 is accommodated in the housing 300. Specifically, the speed reducer 24 is disposed within the space 214. The speed reducer 24 includes a transmission shaft 241, a first transmission gear 242, and a second transmission gear 243.

The transmission shaft 241 is disposed in the housing 300. The center axis CL3 of the transmission shaft 241 is parallel or substantially parallel to the center axis CL1 of the crank shaft 57. In other words, the transmission shaft 241 extends parallel or substantially parallel to the center axis CL1 of the crank shaft 57. As viewed along the axial direction of the transmission shaft 241, i.e., the axial direction of the crank shaft 57, the center axis CL3 defines the center of gyration RC3 of the transmission shaft 241.

By two bearings 44L and 44R, the transmission shaft 241 is supported so as to be rotatable around the center axis CL3. The bearing 44L is fixed to the left housing 300L. The bearing 44R is fixed to the right housing 300R.

The first transmission gear 242 is preferably made of a resin material. The first transmission gear 242 is disposed on the transmission shaft 241. The first transmission gear 242 is disposed closer to the bearing 44L than to the bearing 44R along the axial direction of the transmission shaft 241. The first transmission gear 242 meshes with the output gear 252A. As a result, a driving power which is generated by the electric motor 25 is transmitted from the output gear 252A to the first transmission gear 242. Between the first transmission gear 242 and the transmission shaft 241, a one-way clutch 244 is provided. As a result, the rotary force of the output gear 252A in the forward-rotation direction is transmitted to the transmission shaft 241 via the first transmission gear 242, while the rotary force of the output gear 252A in the backward-rotation direction is not transmitted to the transmission shaft 241. The first transmission gear 242 is larger in diameter than the output gear 252A, and includes more teeth than the output gear 252A. In other words, the speed of the first transmission gear 242 is slower than that of the output gear 252A.

The second transmission gear 243 is preferably made of a metal material (e.g., iron). The second transmission gear 243 is disposed on the transmission shaft 241. The second transmission gear 243 is disposed at a different position from the first transmission gear 242 along the axial direction of the transmission shaft 241. The second transmission gear 243 is fixed to the transmission shaft 241 via a serration coupling (or press-fitting). In other words, the second transmission gear 243 rotates together with the transmission shaft 241.

The rotary shaft 23 is disposed coaxially with the crank shaft 57, and is rotatable with the crank shaft 57. The rotary shaft 23 includes a connecting shaft 231 and a one-way clutch 233.

The connecting shaft 231 preferably has a cylindrical shape. The crank shaft 57 is inserted in the connecting shaft 231. The connecting shaft 231 is disposed coaxially with the crank shaft 57.

The left end (or one end along the axial direction) of the connecting shaft 231 is linked to the crank shaft 57 via a serration coupling or the like. As a result, regardless of whether the crank shaft 57 rotates in the forward-rotation direction or the backward-rotation direction, the connecting shaft 231 rotates together with the crank shaft 57.

A torque sensor 232 is provided around the connecting shaft 231. The torque sensor 232 is supported by the left housing 300L.

The torque sensor 232 detects a torque that occurs in the connecting shaft 231 as the driver moves the pedals. The torque sensor 232 is preferably a torque sensor of the magnetostrictive type. The torque sensor 232 is disposed around the connecting shaft 231. The torque sensor 232 outputs the detected torque signal to a controller which is mounted on the electronic circuit board 200. By referring to the torque signal which has been detected by the torque sensor 232, the controller knows the state of pedaling by the driver, and thus controls the electric motor 25.

The torque sensor 232 includes an attachment shaft 2321, a coil 2322, a detection element 2323, and a shield 2324.

The attachment shaft 2321 is mounted on the outer peripheral surface of the connecting shaft 231, and is rotatable relative to the connecting shaft 231. The coil 2322 is disposed on the outer peripheral surface of the attachment shaft 2321. A predetermined voltage is applied to the coil 2322. The detection element 2323 detects a change in voltage of the coil 2322 that is caused by distortion of the connecting shaft 231. As a result, a torque occurring in the connecting shaft 231, i.e., a torque occurring in the crank shaft 57 rotating integrally with the connecting shaft 231, is detected. The shield 2324 prevents the detection accuracy of the detection element 2323 (i.e., the accuracy with which a change in voltage of the coil 2322 is detected) from being deteriorated by an external magnetic field. The shield 2324 is engaged with a stopper piece 236 (see FIG. 4) that is provided on the housing 300 (or specifically, the left housing 300L). In other words, the shield 2324 does not rotate with the connecting shaft 231.

Along the axial direction of the crank shaft 57, the one-way clutch 233 is disposed closer to the right housing 300R than the torque sensor 232. The one-way clutch 233 is disposed coaxially with the crank shaft 57. The one-way clutch 233 includes a driving member 2331 and a driven member 2332.

The driving member 2331 preferably has a cylindrical shape. At the left end (i.e., the one end along the axial direction) of the driving member 2331, the right end (i.e., the other end along the axial direction) of the connecting shaft 231 is inserted. The driving member 2331 is disposed coaxially with the connecting shaft 231. In this state, the right end (i.e., the other end along the axial direction) of the connecting shaft 231 is linked to the left end (i.e., the one end along the axial direction) of the driving member 2331 via a serration coupling or the like. As a result, regardless of whether the connecting shaft 231 rotates in the forward-rotation direction or the backward-rotation direction, the driving member 2331 rotates together with the connecting shaft 231. In other words, regardless of whether the crank shaft 57 rotates in the forward-rotation direction or the backward-rotation direction, the driving member 2331 rotates together with the crank shaft 57. The connecting shaft 231 and the driving member 2331 function as a crank rotation inputting shaft 234 that rotates integrally with the crank shaft 57.

On the outer peripheral surface of the driving member 2331, an annular attachment surface 233A is provided. The attachment surface 233A extends in the radial direction of the driving member 2331, and extends along the peripheral direction. The attachment surface 233A is located farther to the right side (i.e., toward the other end of axial direction) than to the left end (i.e., the one end along the axial direction) of the driving member 2331. As viewed along the axial direction of the crank shaft 57, the attachment surface 233A is located at a position that overlaps a portion of the electronic circuit board 200.

A ring magnet 46 is fixed to the attachment surface 233A. As viewed along the axial direction of the crank shaft 57, the ring magnet 46 is located at a position that overlaps the driving member 2331. As viewed along the axial direction of the crank shaft 57, the ring magnet 46 is located at a position that overlaps a portion of the electronic circuit board 200.

The ring magnet 46 rotates together with the driving member 2331. Therefore, by using a crank rotation sensor 48A (see FIGS. 3, 6 and 12) which is a detection element provided on the electronic circuit board 200 to detect a change in the magnetic field that is caused by the rotation of the ring magnet 46, rotation of the driving member 2331 (i.e., the crank shaft 57) is detected. In other words, a crank rotation detector is realized, which includes the ring magnet 46 and the detection element 48A.

The crank rotation sensor 48A is mounted on the electronic circuit board 200. The crank rotation sensor 48A opposes the ring magnet 46 along the axial direction of the crank shaft 57.

The driven member 2332 preferably has a cylindrical shape. The crank shaft 57 is inserted in the driven member 2332. The plain bearings 40L and 40R are disposed between the driven member 2332 and the crank shaft 57. As a result of this, the driven member 2322 is disposed so as to be rotatable coaxially with the crank shaft 57.

The left end (i.e., the one end along the axial direction) of the driven member 2332 is inserted at the right end (i.e., the other end along the axial direction) of the driving member 2331. Between the left end (i.e., the one end along the axial direction) of the driven member 2332 and the right end (i.e., the other end along the axial direction) of the driving member 2331, a ratchet mechanism as a one-way clutch mechanism is provided. As a result, a rotary force of the driving member 2331 in the forward-rotation direction is transmitted to the driven member 2332, while the rotary force of the driving member 2331 in the backward-rotation direction is not transmitted to the driven member 2332.

The driven member 2332 is supported by the second bearing 38R so as to be rotatable relative to the housing 300 around the center axis CL1 of the crank shaft 57. The outer ring 385 of the second bearing 38R is free-fitted to the right housing 300R, with the inner ring 384 thereof being press-fitted to the driven member 2332 of the one-way clutch 233.

The driven member 2332 extends through the housing member 212. The drive sprocket wheel 59 is mounted to a portion of the driven member 2332 that is located outside (i.e., on the right side of) the housing 300 via the supporting member 33.

The driven member 2332 includes a gear 2333. The gear 2333 meshes with a gear 241A of the speed reducer 24. The gear 2333 is larger in diameter than the gear 241A, and has more teeth than does the gear 241A. That is, the rotational speed of the gear 2333 is slower than the rotational speed of the gear 241A.

With the driven member 2332, a resultant force outputting shaft 235 which outputs a resultant force combining a human force (pedaling force) which is input via the one-way clutch 233 and a motor driving power which is input via the gear 2333 is realized. In other words, the resultant force outputting shaft 235 is included in the rotary shaft 23.

The mechanism that merges together the pedaling force and the motor driving power, including the driven member 2332 and the gear 2333, may correspond to the synthesizer 58 in FIG. 2. The synthesizer 58 may include, e.g., a cylindrical member, such that the crank shaft 57 is disposed inside the cylindrical member.

Figure 4:
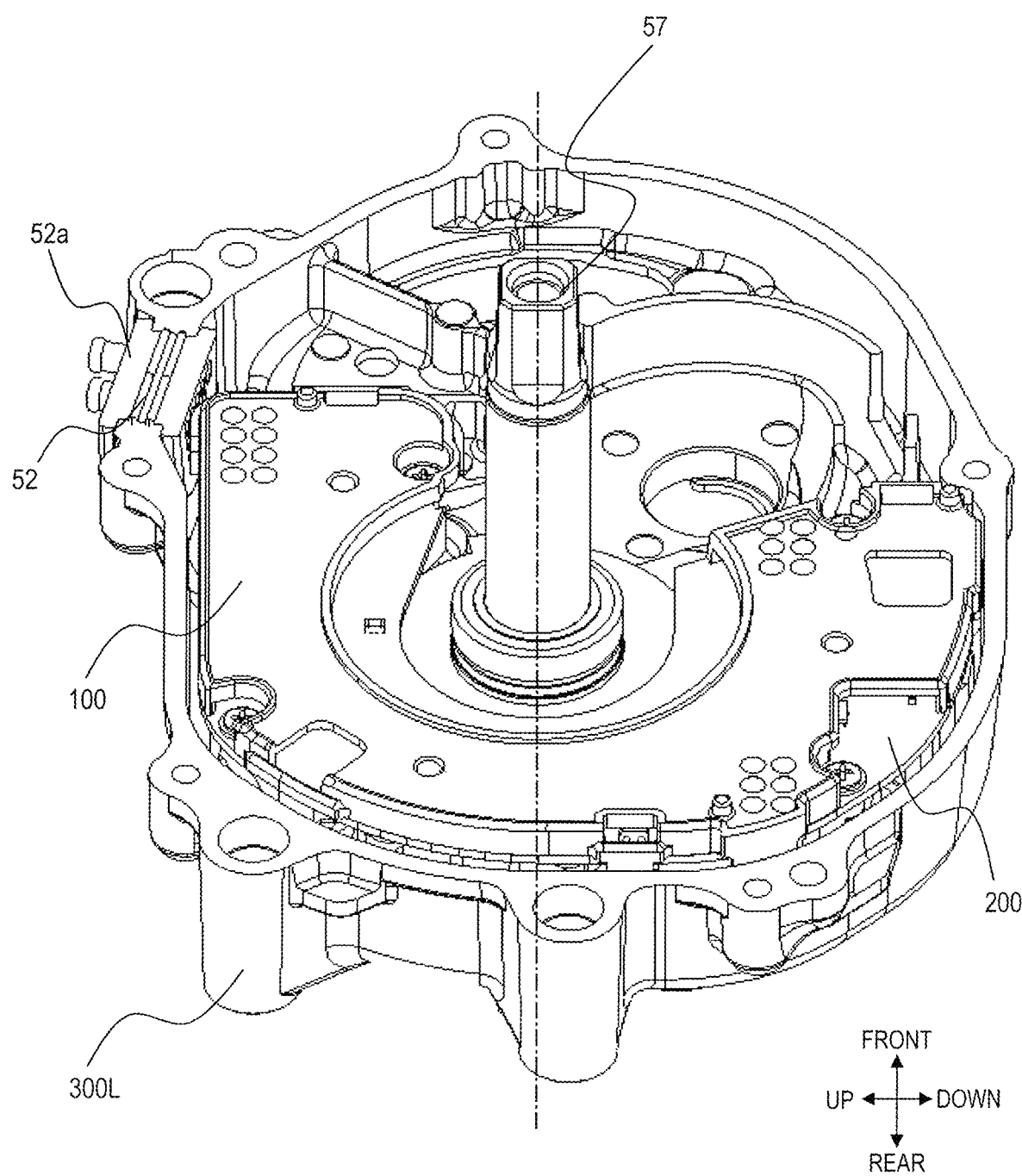
FIG. 4 is a perspective view showing elements that are accommodated in a left housing.

FIG. 4 is a perspective view showing elements which are accommodated in the left housing 300L. In addition to the crank shaft 57, the holder 100 and a portion of the electronic circuit board 200 are shown.

The electronic circuit board 200 controls the supply of electric power to the electric motor 25. The holder 100 and the electronic circuit board 200 surround the crank shaft 57 as viewed along the axial direction of the crank shaft 57. The holder 100 and the electronic circuit board 200 are preferably C-shaped or substantially C-shaped, as viewed along the axial direction of the crank shaft 57. As viewed along the axial direction of the crank shaft 57, the holder 100 and the electronic circuit board 200 do not overlap with the speed reducer 24.

An outlet 52, through which wiring lines that are connected to the electronic circuit board 200 are taken out, is provided in the housing 300. In the present preferred embodiment, a grommet 52a is placed on the outlet 52. The grommet 52a preferably has an elastic body. The grommet 52a is provided for the purposes of protecting the wiring lines 50, and for being dust-proof and water-proof. The wiring lines that are connected to the electronic circuit board 200 pass through the grommet 52a, so as to be led outside of the drive unit 51. The wiring lines connected to the electronic circuit board 200 are connected to the battery 56 (see FIG. 1).

Figure 5:
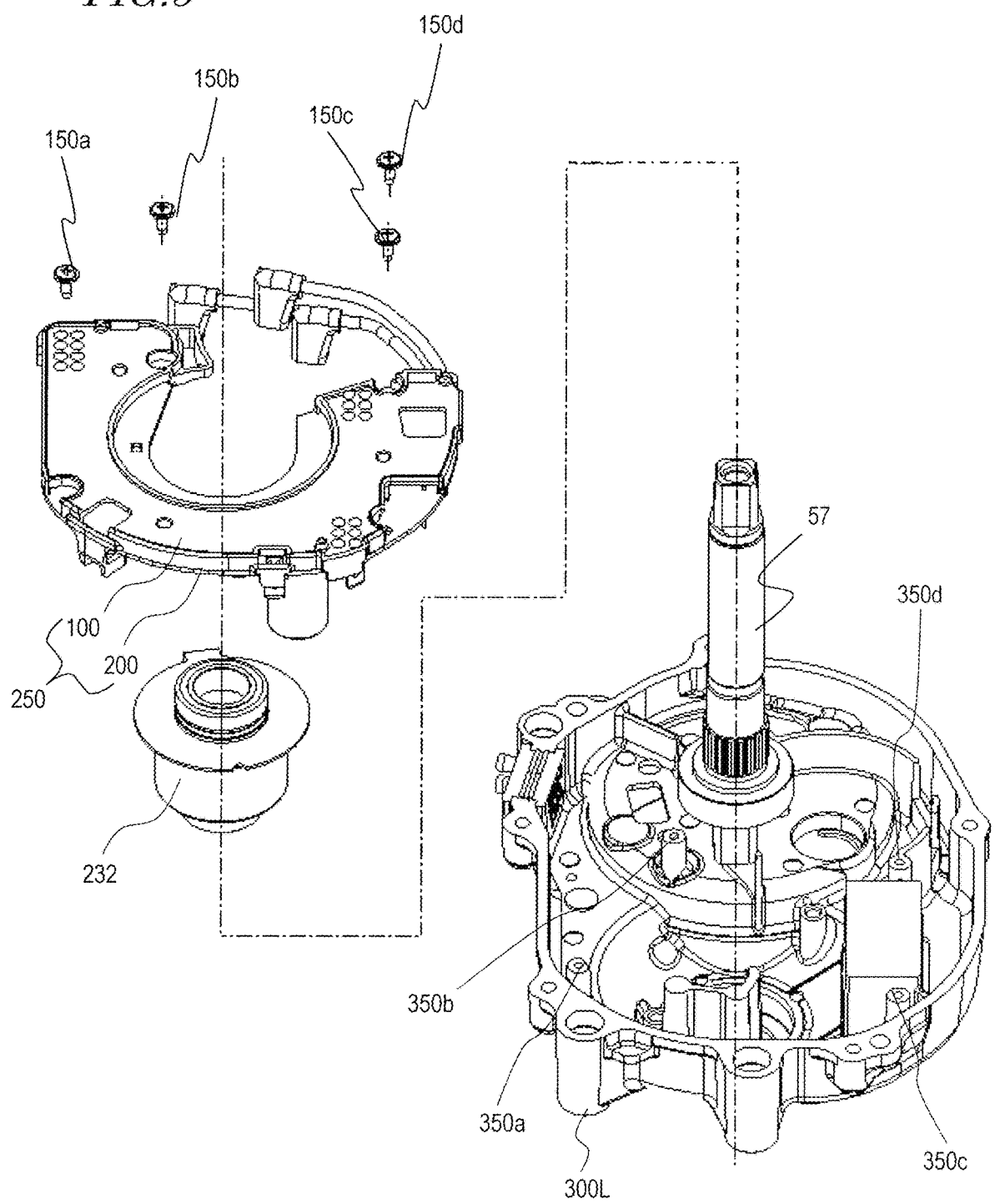
FIG. 5 is an exploded perspective view showing elements that are accommodated in a left housing.

Further, FIG. 5 is an exploded perspective view of elements which are accommodated in the left housing 300L. The crank shaft 57 is inserted in the left housing 300L, with the torque sensor 232, which detects a torque that is applied to the crank shaft 57, being mounted around the crank shaft 57. Thereafter, the electronic circuit board 200, having the holder 100 fixed thereto, is mounted. Finally, screws 150a to 150d, for example, are fastened into the female screw holes 350a to 350d of the housing 300, such that the electronic circuit board 200 and the left housing 300L are fixed to each other.

Hereinafter, the electronic circuit board 200 with the holder 100 fixed thereto will be collectively referred to as the "holder/electronic circuit board 250". In the holder/electronic circuit board 250, the holder 100 is mounted and fixed to the electronic circuit board 200 such that the two are integral. With the crank shaft 57 being in the center, the holder/electronic circuit board 250 is fitted in the left housing 300L so as to surround the crank shaft 57, and is fixed by using predetermined fasteners, e.g., screws.

As shown in FIG. 4 and FIG. 5, in the holder/electronic circuit board 250, the electronic circuit board 200 is accommodated at a deeper position than the holder 100. As used herein, a "deeper position" means, as shown in FIG. 3, a position in a direction away (i.e., left) from the faying surface (line A-A) between the left housing 300L and the right housing 300R. When assembling the drive unit 51, a worker who is holding the holder 100 will insert the holder/electronic circuit board 250 into the left housing 300L in such a manner that the electronic circuit board 200 goes in first.

The holder 100 in the holder/electronic circuit board 250 includes a plurality of types of guides. The schematic nature of each guide is as follows. Details of each guide are to be described below.

The holder 100 includes one or more insertion guides along the outer periphery thereof. Each insertion guide extends along the direction in which the holder/electronic circuit board 250 is inserted (accommodated) into the left housing 300L. When the worker inserts the holder/electronic circuit board 250 into the left housing 300L, each insertion guide abuts with the inner wall of the left housing 300L, thus providing guidance so that the holder/electronic circuit board 250 will be inserted along the inner wall.

By providing each insertion guide, the holder/electronic circuit board 250 is inserted to a position where the holder/electronic circuit board 250 is to be fixed to the left housing 300L with a predetermined posture. When insertion is complete, the screw holes in the electronic circuit board 200 oppose the screw holes in the left housing 300L. Since the worker does not need to perform a task of aligning the positions of screw holes in the electronic circuit board 200 with the positions of the screw holes in the left housing 300L, the work efficiency is greatly improved.

The holder 100 includes one or more screw guides. Each screw guide preferably includes a hole in the holder 100, through which a screw passes through. The diameter of this hole is larger than the diameter of the screw; in other words, the holder 100 is not fastened by the screw. A "hole" may include a recess which is provided with a predetermined space to avoid contacting the head of the screw.

Each screw guide is provided at a position which will oppose a screw hole in the electronic circuit board 200 as the holder 100 becomes fixed to the electronic circuit board 200. Once the worker inserts the holder/electronic circuit board 250 into the left housing 300L for temporary placement, a screw is fastened in reference to the position of each screw guide. A screw hole in the electronic circuit board 200 opposes the position of each screw guide, and, as described above, a screw hole in the left housing 300L opposes the screw hole in the electronic circuit board 200. As a result of this, the worker is able to fasten the screws with an improved work efficiency.

Each screw guide may include a tapered hole. Since the screw guide is tapered, the direction of screw insertion is flexible, such that workability is improved. A tapered hole also allows the screw to stand on its own even if the worker loses hold of the screw, thus making it less likely to drop.

The holder 100 preferably has a shape that covers most of the electronic circuit board 200, with screw guides being provided in portions thereof. When a tool is used to fasten a screw, even if its bit is deviated from the screw head, the bit will abut with the holder 100, but not with the electronic circuit board 200. The holder 100 including the screw guide(s) significantly reduces or prevents the electronic circuit board 200 from becoming damaged.

The holder 100 includes one or more harness guides along its outer periphery. When the holder/electronic circuit board 250 has been inserted into the left housing 300L, the harness guide pushes at least one harness of the electronic circuit board 200 deeper into the left housing 300L. As a screw is fastened in this state, the electronic circuit board 200 and the left housing 300L become fixed to each other.

Providing the harness guide prevents harnesses from being caught between the electronic circuit board 200 and the screw holes in the left housing 300L, or makes it less likely for such pinching to occur.

Note that it suffices if the holder 100 includes any one of the above-described types of guides; so long as any of the above types of guides is included, the benefits and effects corresponding to that type of guide are obtained. It must be noted that not all of the guide types need to be provided. Hereinafter, the holder/electronic circuit board 250 will be described in detail.

Figure 6:
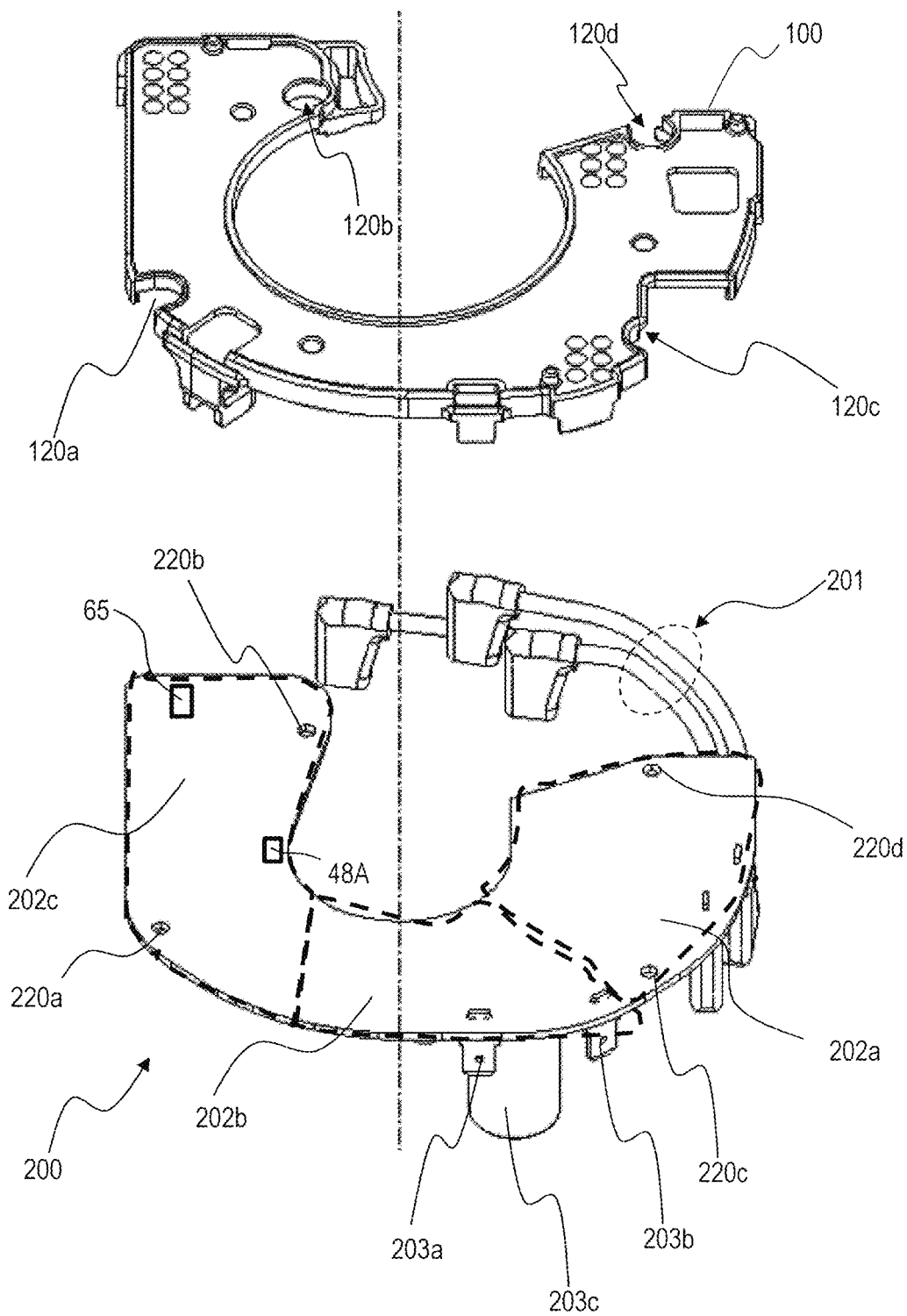
FIG. 6 is a diagram showing a holder and an electronic circuit board.

FIG. 6 shows the holder 100 and the electronic circuit board 200 before being fixed to each other. FIG. 6 illustrates the front surfaces of the holder 100 and the electronic circuit board 200. On the other hand, FIG. 7 illustrates the holder 100 and the electronic circuit board 200 as viewed from the rear side.

As described above, the holder 100 and the electronic circuit board 200 are each preferably C-shaped or substantially C-shaped. When the drive unit 51 is assembled, the crank shaft 57 is to be passed through the space in the center of the C-shape.

The holder 100 and the electronic circuit board 200 may become fixed to each other when they have a specific relative positioning with each other. FIG. 7 shows a plurality of tabs 102a, 102b and 102c of the holder 100 that are used to fix the holder 100 to the electronic circuit board 200. The tabs 102a, 102b and 102c are preferably made of a resin, for example. Note that the number of tabs is only exemplary; at least two tabs may be provided. In the case where there are two tabs, the two tabs are preferably provided at locations substantially opposing the outer periphery of the holder 100.

Figure 7:
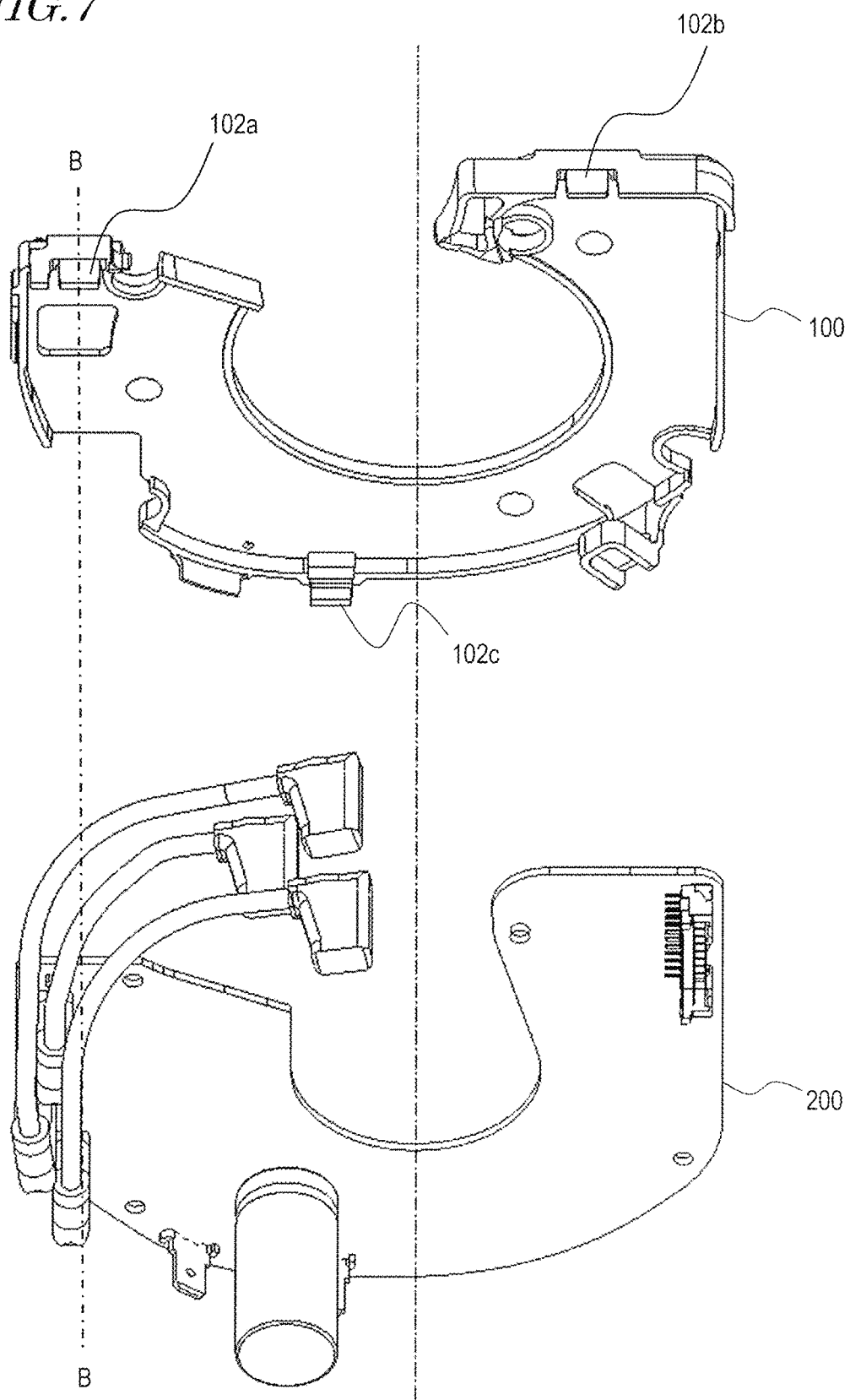
FIG. 7 is a diagram showing a holder and an electronic circuit board as viewed from the rear side.

When the holder 100 and the electronic circuit board 200 have the relative positioning as illustrated in FIG. 6 and FIG. 7, all of the tabs 102a, 102b and 102c of the holder 100 are engaged with the electronic circuit board 200.

Figure 8:
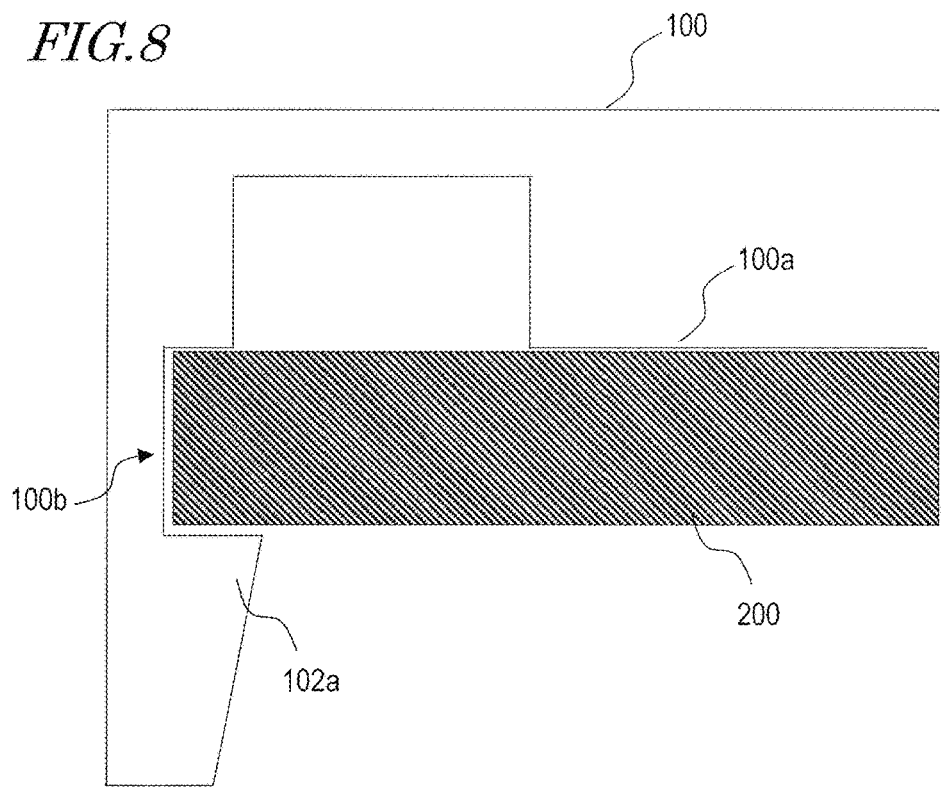

FIG. 8 is a side view of the electronic circuit board 200 being retained by the tab 102a. FIG. 8 shows a side surface at line B-B in FIG. 7. As shown in the figure, the tab 102a of the holder 100 is engaged with the electronic circuit board 200, such that the holder 100 and the electronic circuit board 200 become fixed to each other.

The holder 100 and the electronic circuit board 200 are fixed to each other via the three tabs 102a, 102b and 102c. Furthermore, in the present preferred embodiment, a rib 100a of the holder 100 is in contact with the electronic circuit board 200. The rib 100a is provided along the periphery of the holder 100, and is in contact with the electronic circuit board 200. As a result, the holder 100 and the electronic circuit board 200 are fixed to each other in a stable manner.

Figure 9:
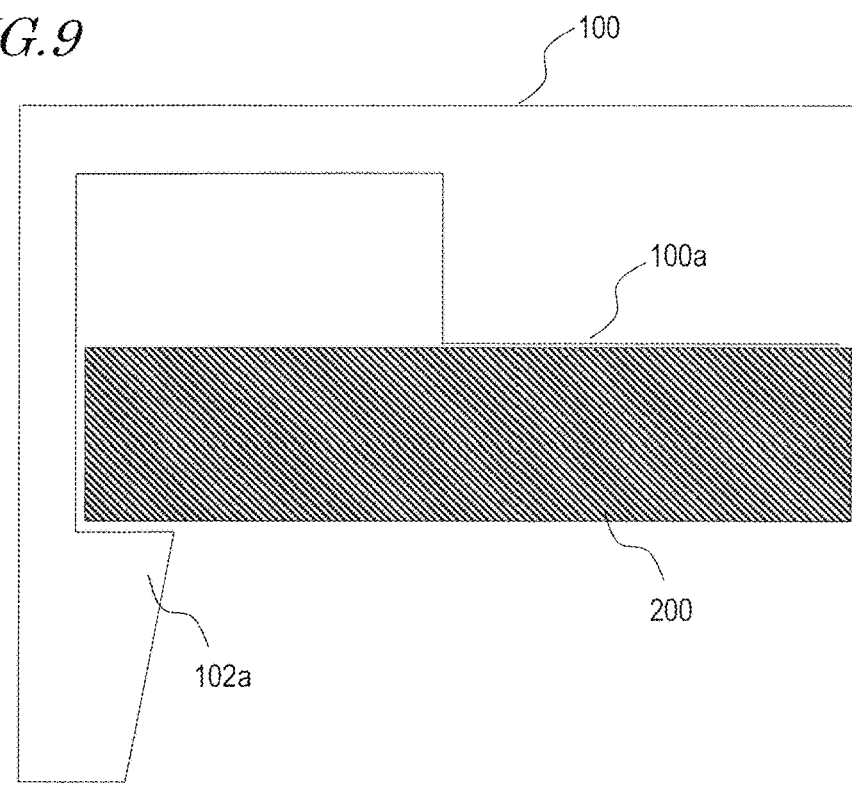
FIG. 9 is a diagram showing the structure of a tab 102a which has no indent but instead a barbed tip.

Although the tab 102a shown in FIG. 8 includes an indent 100b, the indent 100b is not a requirement. FIG. 9 is a side view showing the structure of a tab 102a which has no indent, but instead a barbed tip. When the tab 102a includes a barb, the holder 100 and the electronic circuit board 200 become engaged even without an indent 100b.

Since the tabs 102a, 102b and 102c are engaged with the electronic circuit board 200 at predetermined positions, the worker is able to very easily combine the holder 100 and the electronic circuit board 200 to obtain the holder/electronic circuit board 250.

FIG. 6 shows holes 220a to 220d which are provided in the electronic circuit board 200. When the holder 100 is fixed to the electronic circuit board 200 by the tabs 102a, 102b and 102c, the holes 220a to 220d in the electronic circuit board 200 are opposed to screw guides 120a to 120d (described below) of the holder 100. Based on the positions of the screw guides 120a to 120d, the worker is able to easily know where to fasten the screws.

Electronic circuit elements, wiring lines, and the like are disposed on the electronic circuit board 200. For example, the electronic circuit board 200 includes a plurality of harnesses 201, a negative terminal 203a, a plus terminal 203b, and a capacitor 203c. Each harness 201 includes a bundle of a plurality of (e.g., three) current cables, such that one end of the harness 201 is connected to connectors on the electronic circuit board 200 and the other thereof is connected to the electric motor 25 (FIG. 1). The electronic circuit board 200 may be generally classified into a power block 202a, an electrical supply block 202b, and a control block 202c. A motor driving circuit (inverter circuit) is provided in the power block 202a. A power circuit is provided in the electrical supply block 202b.

A control circuit that causes the electrically assisted bicycle 1 to operate is provided in the control block 202c. The control circuit may be a semiconductor integrated circuit such as a microprocessor, a microcontroller, or the like, and determines an assistance force to be generated by the electric motor 25 in accordance with a travel velocity of the electrically assisted bicycle 1, the magnitude of the torque which has been applied by the rider, etc.

By keeping the power block 202a and the control block 202c away from each other, noise which is generated in the power block 202 is less likely to intrude into the control block 202c. This allows the electronic circuit elements in the control block 202c to operate in a more stable manner. Since the inverter circuit in the power block 202a and the electric motor 25 are to be placed close to each other, the harness(es) 201 to provide connection therebetween is short, thus reducing energy losses.

Since the electronic circuit board 200 is adjacent to the crank shaft 57, the crank rotation sensor 48A, which defines a crank rotation detector to detect the rotational speed of the crank shaft 57, is also be provided in the control block 202c. Furthermore, some of the newer electrically assisted bicycles tend to use an acceleration sensor. An acceleration sensor is a small-sized (e.g., several millimeters by several millimeters) electronic element which detects the acceleration of the actual vehicle body of the electrically assisted bicycle 1. The acceleration sensor may also be disposed in the control block 202c. FIG. 6 illustrates an exemplary position of the acceleration sensor 65.

The acceleration sensor 65 may be a 3-axis acceleration sensor of, e.g., the piezoresistance type, capacitance type, or thermal detection type. In one sensor, a 3-axis acceleration sensor is able to measure an acceleration in each direction along the three perpendicular axes (the X axis, the Y axis, and the Z axis). The directions of detection along the X, Y, and Z axes are based on a state where the sensor chip is placed on the horizontal plane. However, the manner in which the electronic circuit board 200 is disposed in the drive unit 51 may be vertically upright, or inclined therefrom. Therefore, the above-described microprocessor or the like may perform computations to correct any direction that has been detected by the sensor chip.

Figure 10:
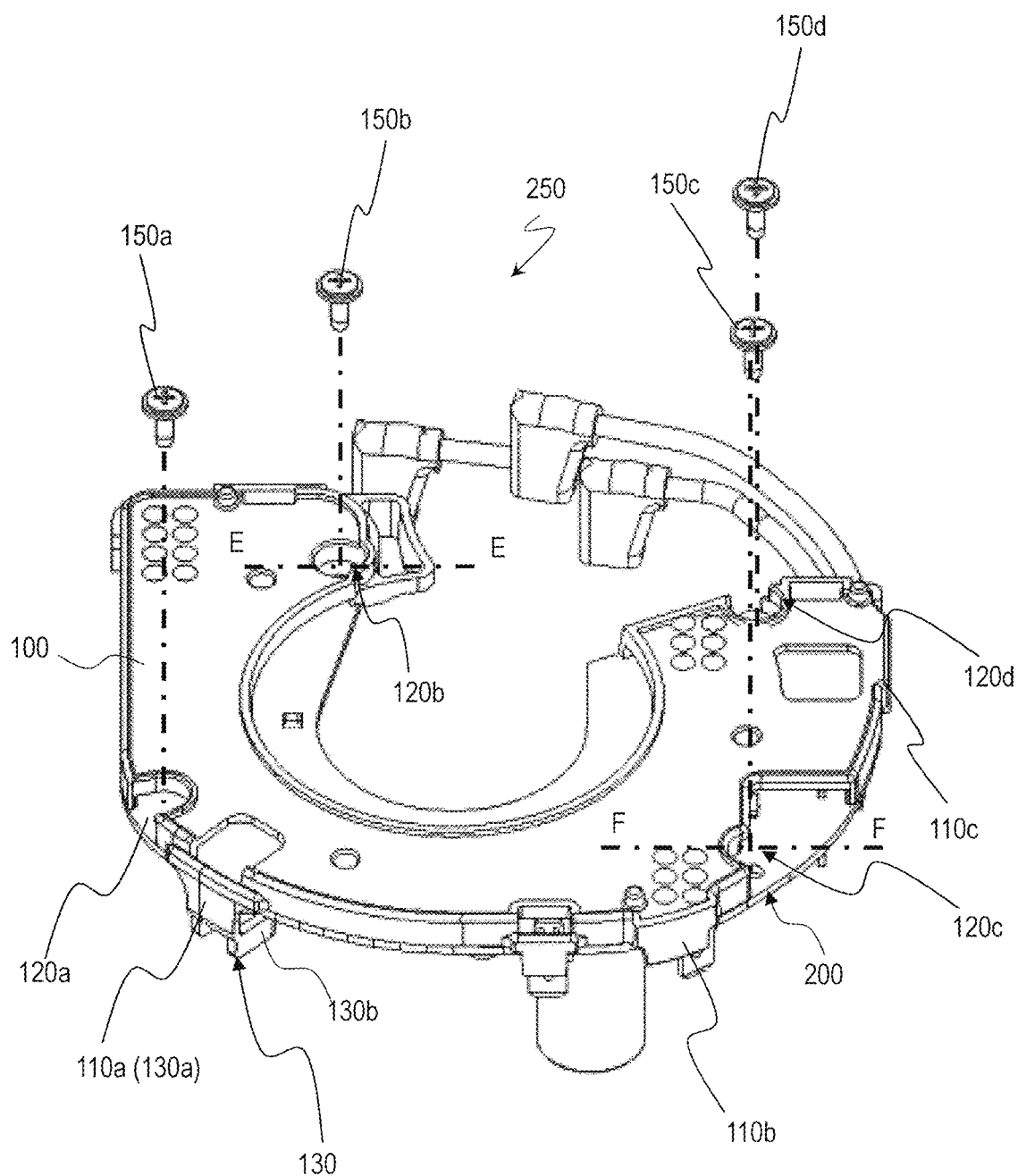
FIG. 10 is a perspective view for describing a plurality of types of guides that are provided on the holder.
Figure 11:
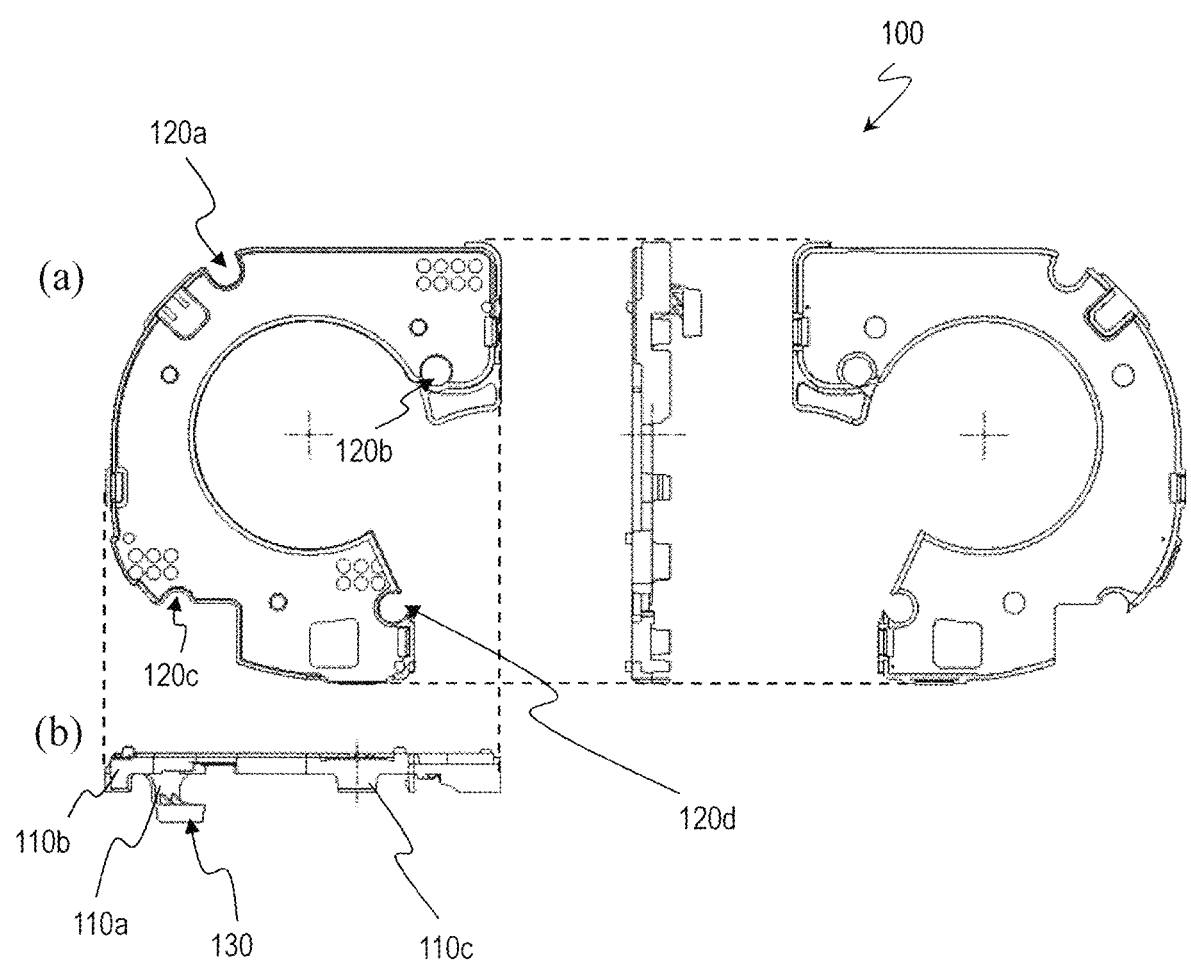
FIG. 11 includes a plan view (a) and a side view (b) for describing a plurality of types of guides that are provided on the holder 100.

FIG. 10 is a perspective view for describing a plurality of types of guides that are provided on the holder 100. For convenience of explanation, FIG. 10 illustrates the holder/electronic circuit board 250. FIG. 11 includes a plan view (a) and a side view (b) for describing a plurality of types of guides that are provided on the holder 100. For reference sake, a bottom view and a side view in another direction are also shown.

Hereinafter, each guide will be described with reference to FIG. 10 and FIG. 11.

The holder 100 includes insertion guides 110a to 110c, screw guides 120a to 120d, and a harness guide 130.

The insertion guides 110a to 110c are provided at the outer periphery of the holder 100. The insertion guides 110a to 110c extend in the lower direction in the figure. This direction is the direction in which the holder/electronic circuit board 250 is inserted (accommodated) into the left housing 300L.

When the holder/electronic circuit board 250 is inserted into the left housing 300L, the insertion guides 110a to 110c abut with the inner wall of the left housing 300L, thus restricting motion of the holder/electronic circuit board 250. By providing the insertion guides, fluctuations in the inserted position of the holder/electronic circuit board 250 in the left housing 300L and rattling of the holder/electronic circuit board 250 are significantly reduced or prevented.

Figure 12:
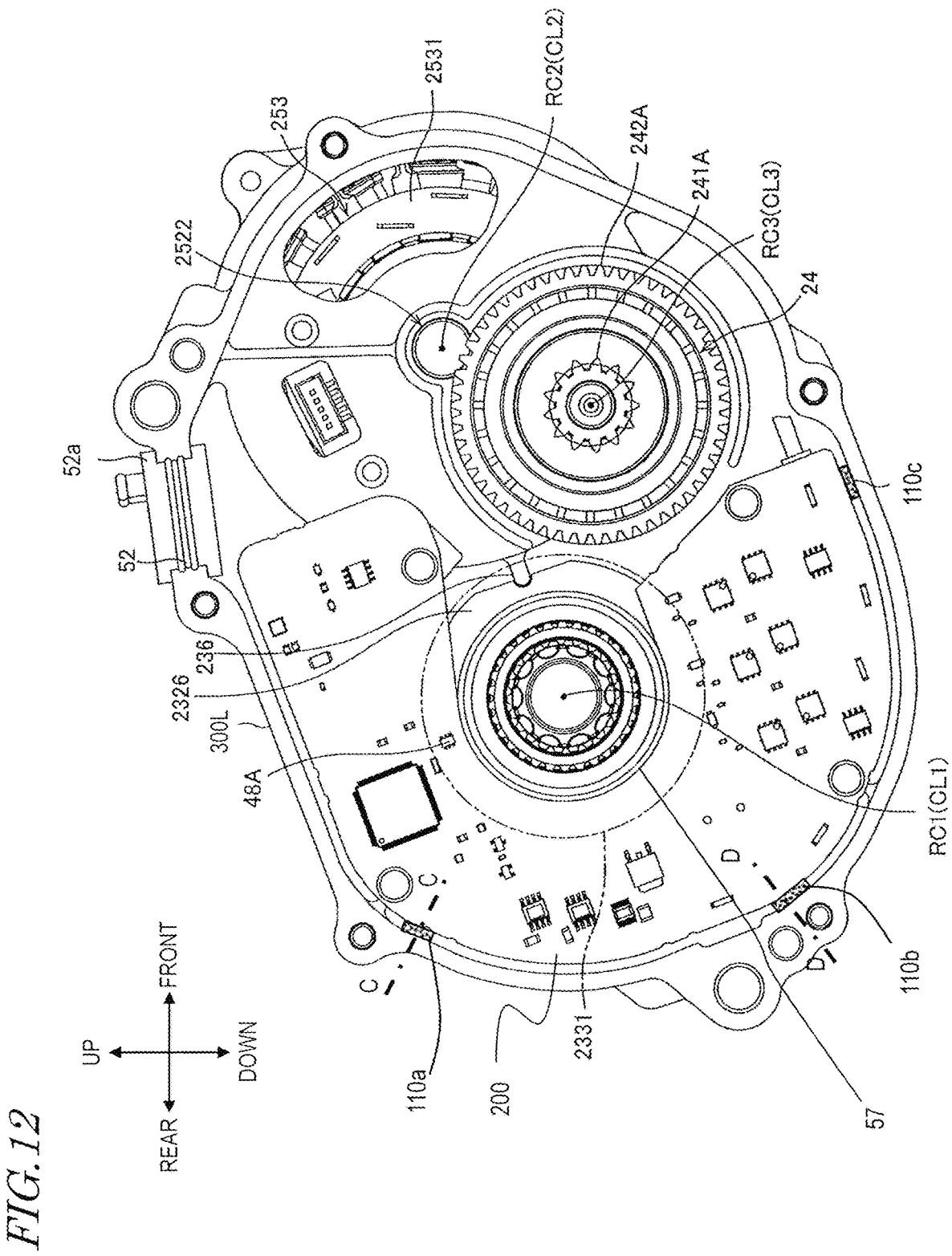
FIG. 12 is a diagram mainly showing the electronic circuit board 200 accommodated in the left housing 300L.

FIG. 12 mainly shows the electronic circuit board 200 accommodated in the left housing 300L. In FIG. 12, the right housing 300R has been removed, and only the insertion guides 110a to 110c on the holder 100 are shown. In FIG. 12, the driving member 2331 is shown by an imaginary line.

From FIG. 12 it can be seen that the insertion guides 110a to 110c on the holder 100 are located between the electronic circuit board 200 and the left housing 300L. This will be further explained with reference to cross-sectional views.

Figure 13:
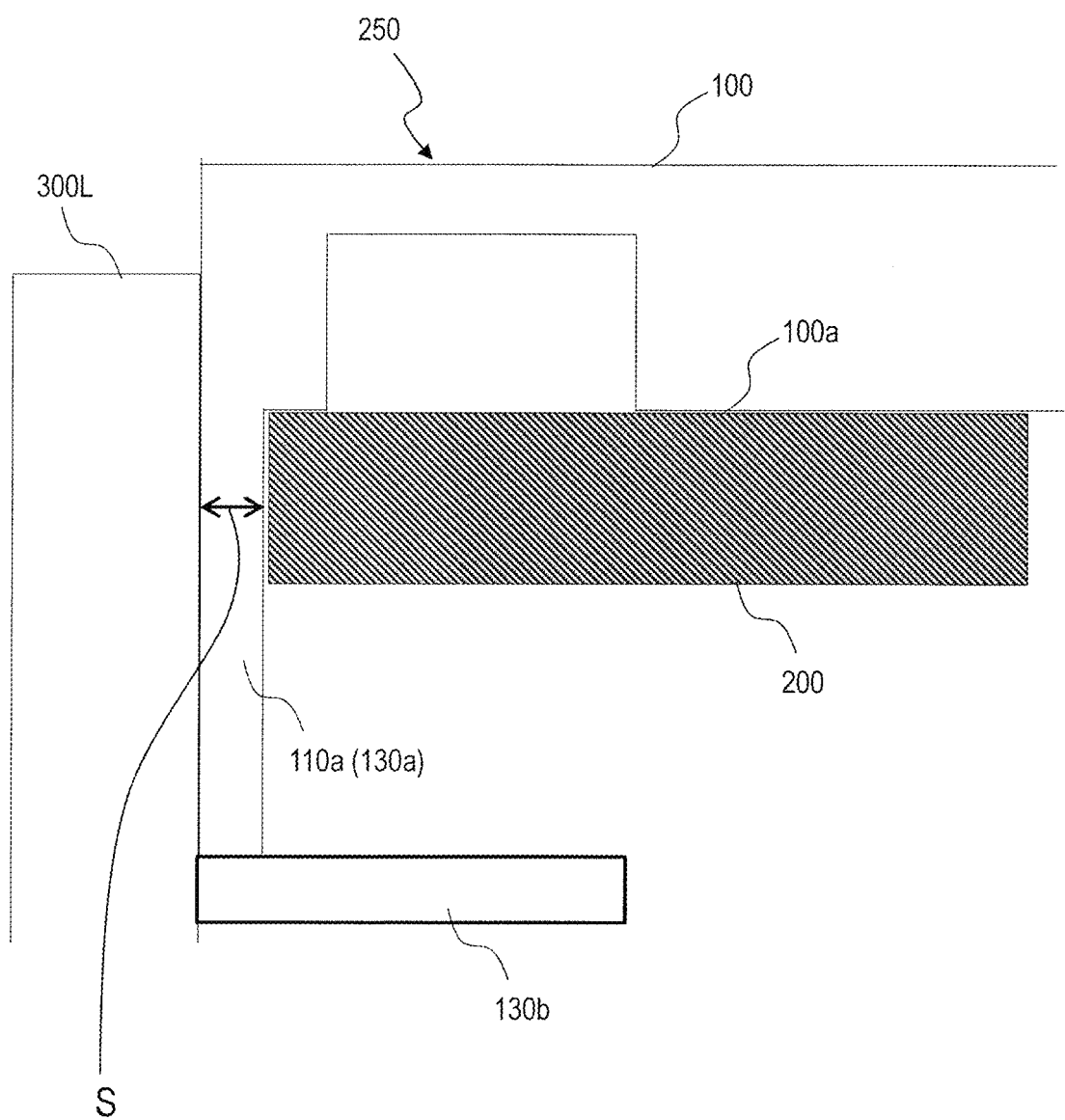
Figure 14:
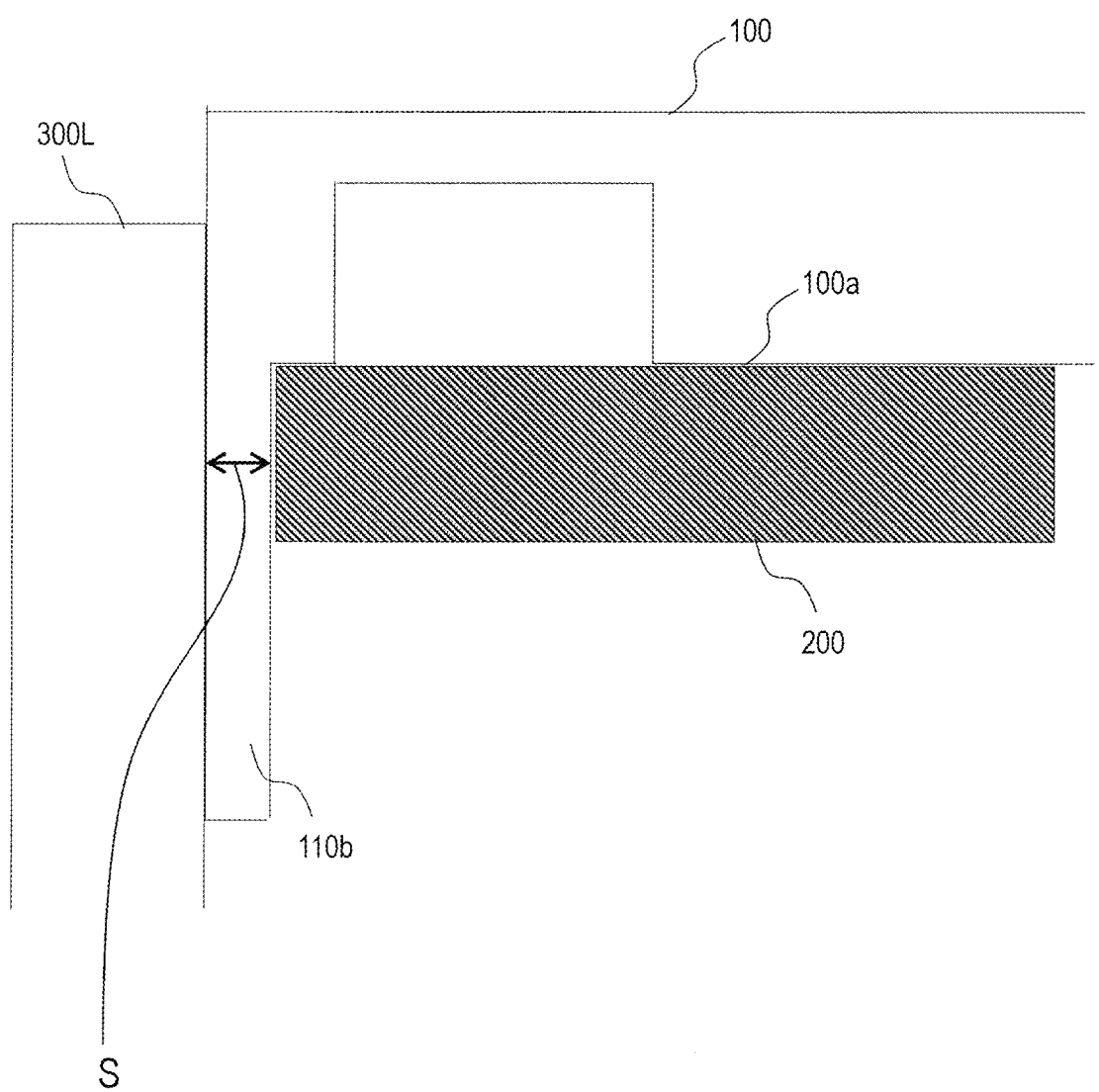
FIG. 14 is a cross-sectional view of an insertion guide 110b.

FIG. 13 is a cross-sectional view of the insertion guide 110a. FIG. 13 shows a cross section taken along line C-C in FIG. 12. As will be described below, the insertion guide 110a also defines and functions as a first guide member 130a of the harness guide 130. FIG. 14 is a cross-sectional view of the insertion guide 110b. FIG. 14 shows a cross section taken along line D-D in FIG. 12. Since the insertion guide 110c would have substantially an identical cross section to that of the insertion guide 110b, it is omitted from illustration in the figure and the description.

As all of the insertion guides 110a to 110c abut with the inner wall surface of the left housing 300L, the holder 100 fits along the inner wall surface of the left housing 300L perfectly. As a result, the above-described fluctuations in the inserted position of the holder/electronic circuit board 250 and rattling of the holder/electronic circuit board 250 are significantly reduced or prevented.

As shown in FIG. 13, the insertion guide 110a is located between the electronic circuit board 200 and the left housing 300L, such that the electronic circuit board 200 and the left housing 300L are spaced apart by a distance S. Stated otherwise, the insertion guide 110a is provided so as to protrude outside of the electronic circuit board 200 by the distance S to provide electrical insulation. Since an electric current flows in the electronic circuit board 200, the electronic circuit board 200 is fixed without contacting the left housing 300L, which is made of a metal. Therefore, the electronic circuit board 200 is designed so that its outer edge is spaced apart from the inner wall surface of the left housing 300L by the distance S. The worker ensures that the insertion guides 110a to 110c abut against the inner wall surface of the left housing 300L while fitting the holder/electronic circuit board 250 into the left housing 300L. As a result of this, the holder/electronic circuit board 250 is perfectly fitted into the left housing 300L.

In the present preferred embodiment, the distance S is about 1 mm, for example. Except at the insertion guides 110a to 110c, the outer edge of the holder 100 coincides or substantially coincides with the outer edge of the electronic circuit board 200. The electronic circuit board 200 maintains a gap by the distance S from the inner wall surface of the left housing 300L. However, the distance S may not be constant, and may vary.

These features are designed so that, once the holder/electronic circuit board 250 has been fitted into the left housing 300L, the screw holes in the electronic circuit board 200 oppose the screw holes in the left housing 300L. Since the worker does not need to perform a task of aligning the positions of the screw holes in the electronic circuit board 200 with the positions of the screw holes in the left housing 300L ("alignment task"), the work efficiency is greatly improved.

Note that the number of insertion guides to be provided may be arbitrary, and at least one insertion guide may be provided. However, it is preferable to provide three insertion guides as in the present preferred embodiment, or even four or more insertion guides, for example. By providing three or more insertion guides, the holder/electronic circuit board 250 maintains a stable posture, thus further facilitating and better ensuring alignment.

In the present preferred embodiment, the insertion guide 110a preferably defines a portion of the harness guide 130, as will be described below.

The screw guides 120a to 120d are provided at locations which will oppose the screw holes in the electronic circuit board 200 as the holder 100 becomes fixed to the electronic circuit board 200. In the example shown in the figure, each of the screw guides 120a, 120c and 120d is preferably a hole defining a semicircular (non-circular) recess, for example, while the screw guide 120b is preferably a circular hole.

Figure 15:
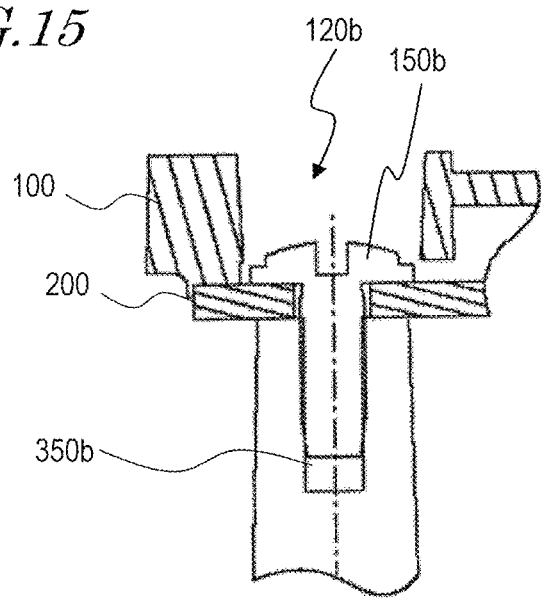
FIG. 15 is a cross-sectional view of a screw guide 120b.
Figure 16:
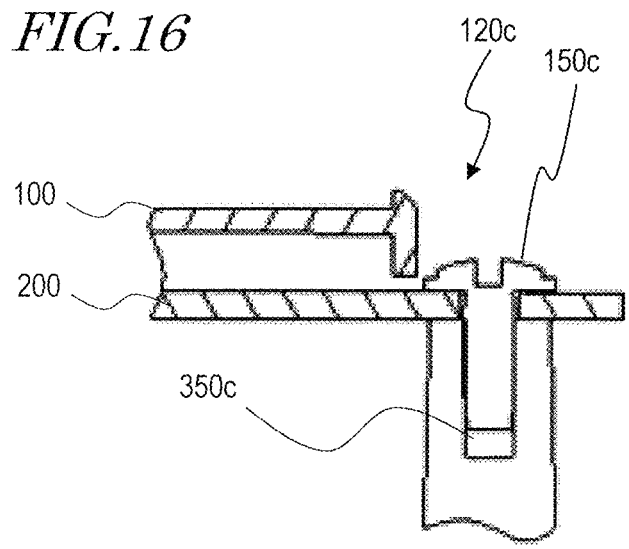
FIG. 16 is a cross-sectional view of a screw guide 120c.

FIG. 15 is a cross-sectional view of the screw guide 120b. FIG. 15 shows a cross section taken along line E-E in FIG. 10. FIG. 16 is a cross-sectional view of the screw guide 120c. FIG. 16 shows a cross section taken along line F-F in FIG. 10. Note that, depending on the exact manner of taking a cross section, the screw guides 120a and 120d may also be as depicted in FIG. 15 or FIG. 16.

As shown in FIG. 15, the hole of the screw guide 120b, the hole in the electronic circuit board 200, and a female screw hole 350b in the left housing 300L oppose one another. By providing the screw guide 120b, it is easier for the worker to see the hole in the electronic circuit board 200, and allow the screw 150b to be easily inserted into the hole in the electronic circuit board 200. The screw 150b passes through the hole-shaped screw guide 120b and the hole in the electronic circuit board 200 that is opposed to the screw guide 120b so as to be fastened into the female screw hole 350b (FIG. 5) in the left housing 300L.

The same also applies to the example of FIG. 16. Even through the recessed hole 120c, it is easy to see the hole in the electronic circuit board 200. Moreover, the screw 150b is easily moved along the unrecessed portion of the holder 100 to be inserted into the hole in the electronic circuit board 200. The screws 150a, 150c and 150d pass through the holes in the electronic circuit board 200 that respectively oppose the screw guides 120a, 120c and 120d so as to be fastened into the female screw holes 350a, 350c and 350d (FIG. 5) in the left housing 300L. The distance from the outer periphery defining an edge of the recess to the hole in the electronic circuit board 200 defines a space that prevents the head of the screw from contacting the electronic circuit board 200 during fastening of the screw.

Thus, by using the screws 150a to 150d, the electronic circuit board 200 is fixed to the left housing 300L.

Each of the screw guides 120a to 120d may be a cylindrical hole through the holder 100, or may have a non-perfectly cylindrical shape. For example, each screw guide may have a shape resulting by removing a portion of a cylinder (a recessed shape). Any such screw guide is a "hole" in the holder 100. Even if the opening has the shape of, for example, a quarter circle or a semicircle, such a screw guide is still regarded as a "hole" in the holder 100. The opening of each of the screw guides 120a to 120d in the present preferred embodiment as illustrated in FIG. 10 and FIG. 11 has a semicircular shape, or a shape that is closer to a circle than a semicircle. Any such screw guide 120a to 120d is considered to be a "hole" in the holder 100. Note that the opening shape is preferably a semicircle rather than a quarter circle, and more preferably a circle rather than a semicircle.

Furthermore, the screw guides 120a to 120d may be tapered holes (including recesses).

Hereinafter, with reference to FIG. 17 to FIG. 19, examples in which the screw guide 120b is a tapered hole will be described.

Figure 17:
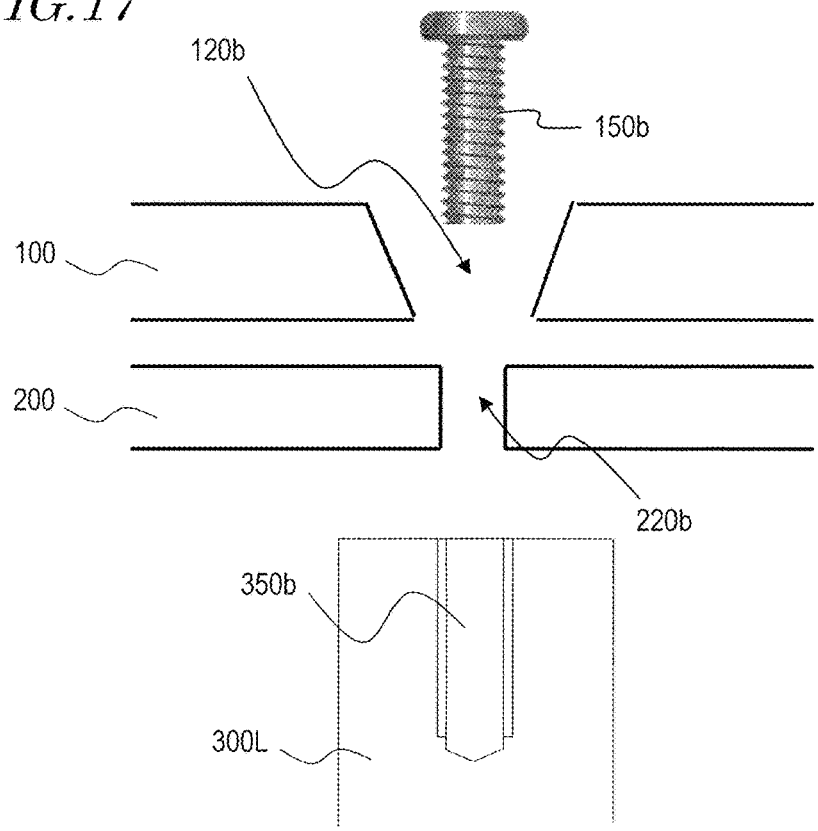
FIG. 17 is a cross-sectional view of a holder (including a tapered screw guide), an electronic circuit board, and a left housing.
Figure 18:
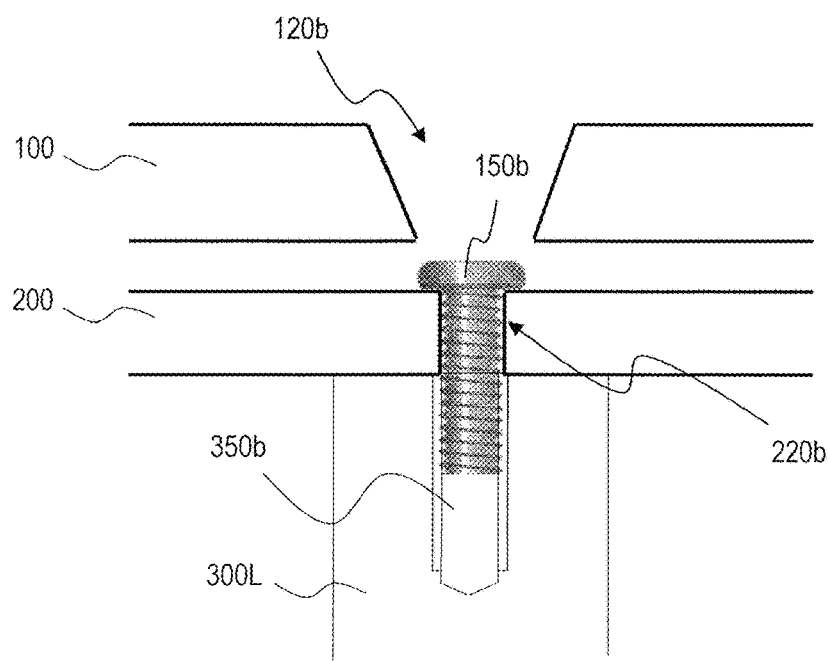
FIG. 18 is a diagram showing an electronic circuit board and a left housing being fixed by a screw.

FIG. 17 is a cross-sectional view of the holder 100 (including the tapered screw guide 120b), the electronic circuit board 200, and the left housing 300L. As described above, once the holder 100 is fixed to the electronic circuit board 200, the hole of the screw guide 120b and the hole 220b in the electronic circuit board 200 oppose each other. Furthermore, once the holder/electronic circuit board 250 is inserted in the left housing 300L, the hole 220b in the electronic circuit board 200 and the female screw hole 350b oppose each other. In this state, the screw 150b is able to easily pass through the holder 100 and the electronic circuit board 200, and be inserted into the female screw hole 350b in the left housing 300L, thus allowing the electronic circuit board 200 and the left housing 300L to be fixed to each other. FIG. 18 shows the electronic circuit board 200 and the left housing 300L as fixed by the screw 150b.

Figure 19:
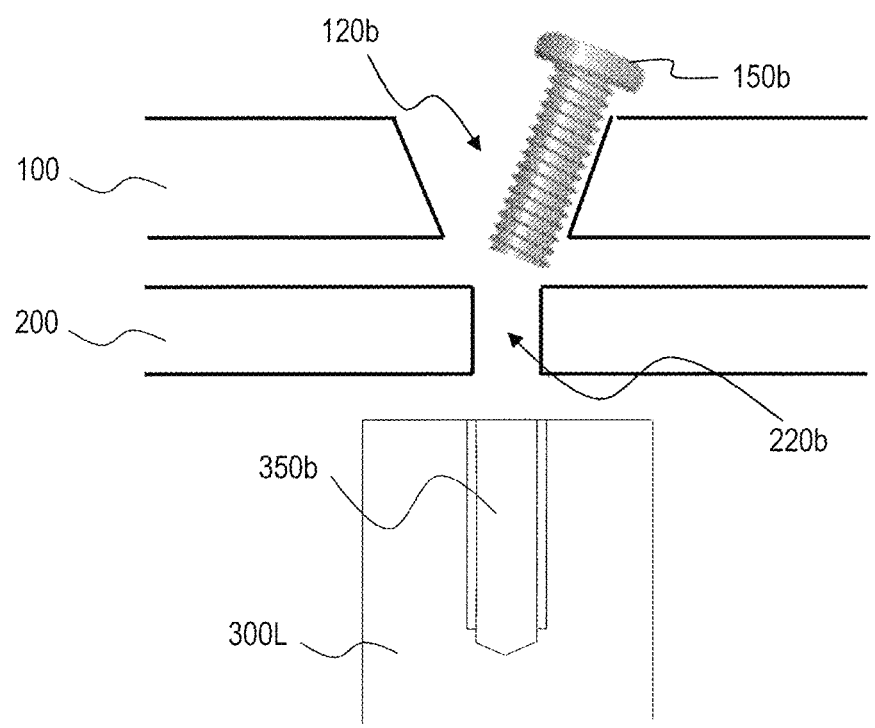
FIG. 19 is a diagram for describing how a tapered screw guide prevents a screw from dropping.

FIG. 19 is a diagram for describing how the tapered screw guide 120b is able to prevent the screw 150b from dropping. Since the screw guide 120b is tapered, even if the worker loses hold of the screw 150b, the screw 150b will remain in the screw guide 120b. Thus, the screw 150b is less likely to drop into the left housing 300L shown below in the figure.

By providing the screw guide 120b with a tapered shape, the worker's task of inserting the screw 150b is also facilitated. The worker may insert the leading end of the screw 150b into the screw guide 120b including an opening that is wider than the diameter of the screw 150b. After the leading end of the screw 150b has been inserted, the screw 150b is guided along the tapered surface (inner peripheral surface) of the screw guide 120b until securely reaching the hole 220b in the electronic circuit board 200.

The screw guides 120a, 120c and/or 120d may also have a tapered shape, because, regardless of the geometric area of the tapered surface, a tapered surface is able to at least function as a guide for the screw 150b. Therefore, even if the opening is nothing but, e.g., a quarter circle, it still qualifies as a screw guide within the meaning of the present preferred embodiment so long as it has a tapered surface. However, the closer the opening is to a circle, the better it serves the function of a guide. Therefore, the tapered screw guide preferably includes an opening which is at least a semicircle. So long as the tapered screw guide includes an opening which is at least a semicircle, it sufficiently functions as a guide.

Next, referring back to FIG. 10, the harness guide 130 will be described.

When the holder/electronic circuit board 250 has been inserted into the left housing 300L, the harness guide 130 causes at least one harness disposed at the rear surface of the electronic circuit board 200 to be pushed deeper into the left housing 300L.

The harness guide 130 preferably includes two guide members 130a and 130b that are connected to each other. The first guide member 130a functions as the insertion guide 110a. On the other hand, the second guide member 130b extends in a direction that is perpendicular or substantially perpendicular to the first guide member 130a. In the present preferred embodiment, the second guide member 130b extends toward the space in the center of the C-shape, through which the crank shaft 57 is passed.

Figure 20:
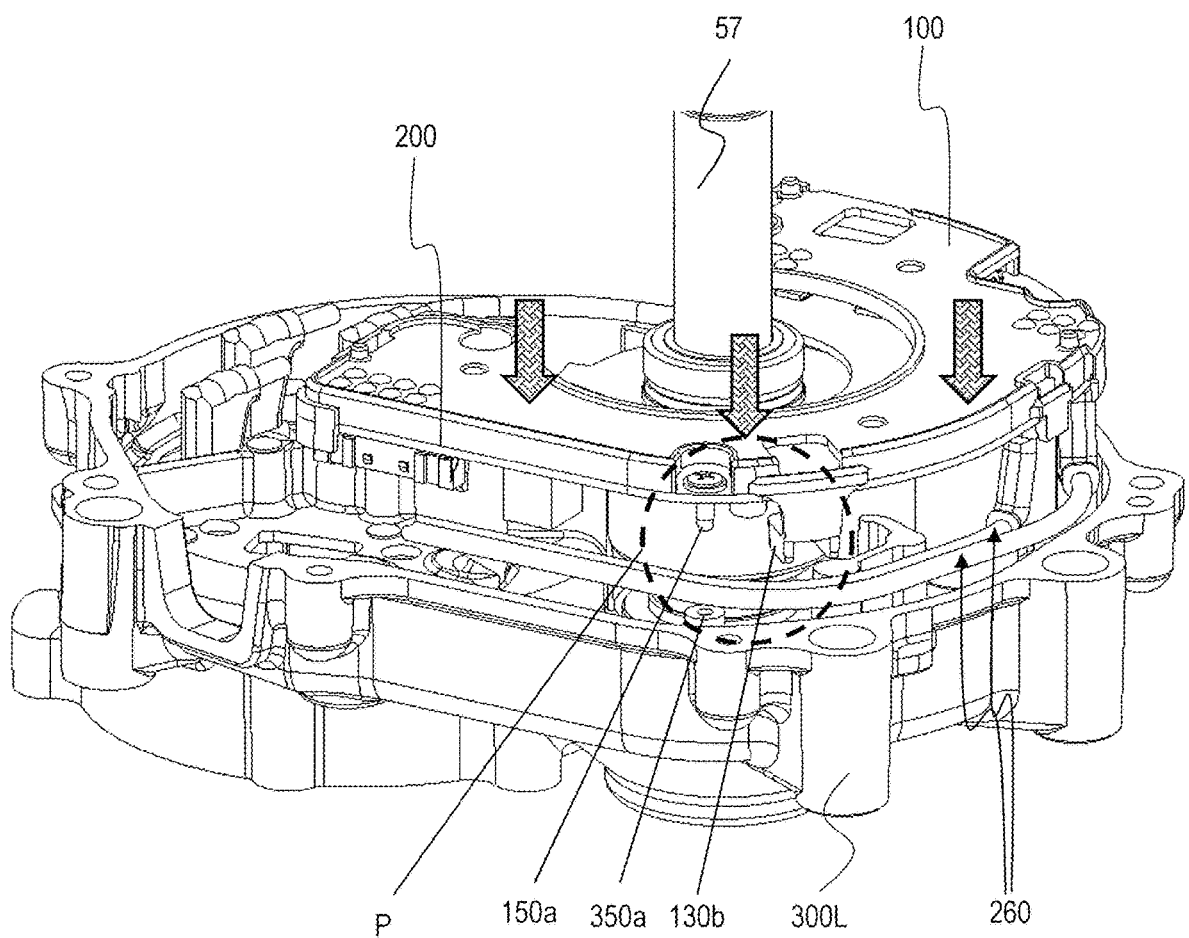
FIG. 20 is a diagram showing relative positioning between the lower end position of a screw 150a, the lower end position of a second guide member 130b, and a harness 260 when the holder 100 is fitted into the left housing 300L.

FIG. 20 shows relative positioning between the lower end position of the screw 150a, the lower end position of the second guide member 130b, and the harness 260, when the holder 100 is fitted into the left housing 300L.

A portion P indicated by a broken line will be discussed. Regarding the lower end position of the screw 150a and the lower end position of the second guide member 130b, it is the lower end position of the second guide member 130b that is closer to the harness 260. Therefore, as the holder 100 is pressed in the direction of the arrows in the figure by the worker, the second guide member 130b will contact the harness 260 before the screw 150a does. As the holder 100 is further pressed in the direction of the arrows in the figure by the worker, the harness 260 will be further pushed by the second guide member 130b into the left housing 300L (i.e., in the lower direction in the figure).

Figure 21:
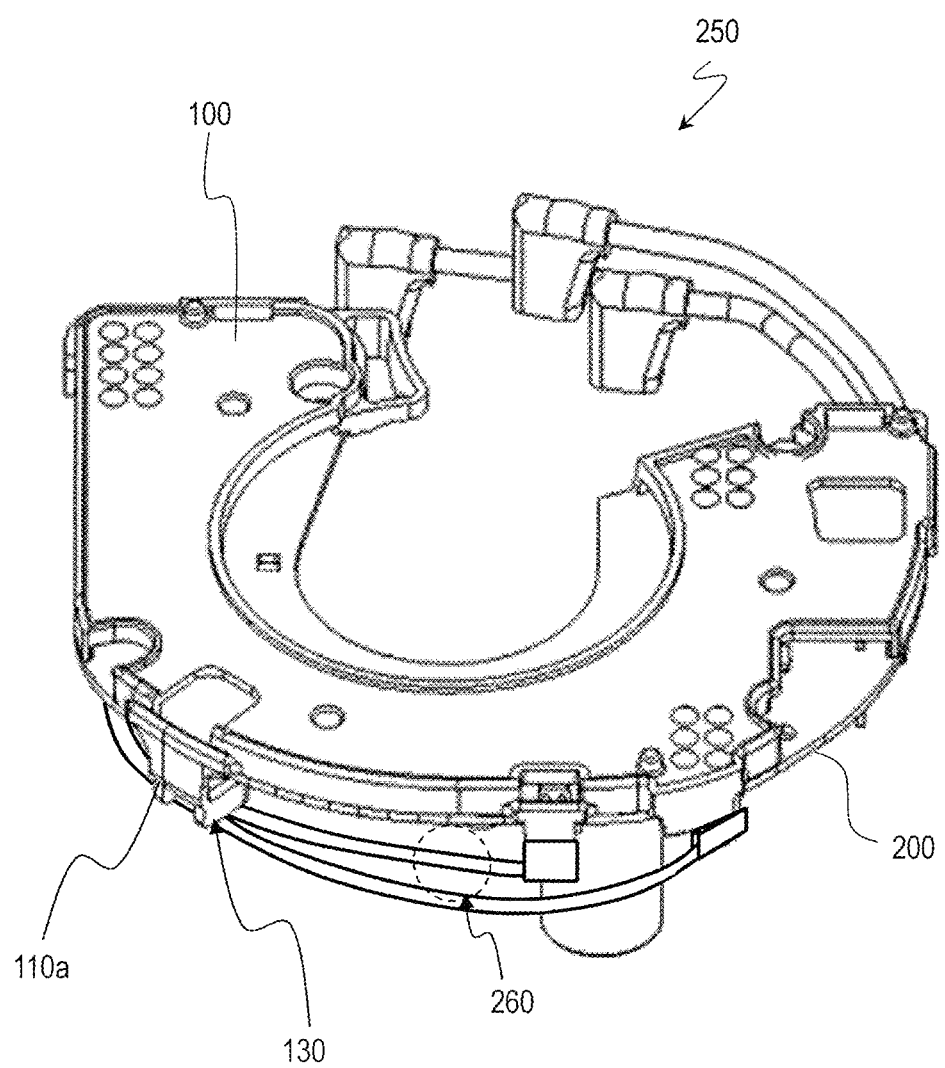
FIG. 21 is a diagram showing the harness 260 having been pushed back by the harness guide 130.

FIG. 21 shows the harness 260 having been pushed back by the harness guide 130. The left housing 300L is omitted from illustration. By providing the harness guide 130, the harness 260 is prevented from closely contacting the rear surface of the electronic circuit board 200, and rather a space, at least measuring a distance corresponding to the structure of the harness guide 130, is provided. As a result, when the screw 150a is fastened into the female screw hole 350a, the harness 260 will not be caught between the electronic circuit board 200 and the female screw hole 350a.

In the present preferred embodiment, the fact that the second guide member 130b protrudes in a radial direction (i.e., toward the crank shaft 57) ensures that contact with the second guide member 130b will occur. That is, once the holder 100 is pushed in, the harness 260 will be pushed back by the second guide member 130b, rather than be able to stay in the position shown in the figure. Thus, the harness 260 will not be caught between the electronic circuit board 200 and the female screw hole 350a. This will significantly reduce the possibility that the harness may become caught between them before the worker knows, and the screw be fastened in this state and damage the harness.

As discussed above, when the harness is provided along the outer edge of the electronic circuit board 200, i.e., provided along the circumference of the C-shape, the second guide member 130b protruding in a radial direction (i.e., toward the crank shaft 57) allows the harness to be pushed back more certainly.

It is assumed in FIG. 20 and FIG. 21 that the harness includes a plurality of battery current lines (a plus (+) signal line and a negative (−) signal line). However, in the present invention, the harness to be pressed down may be any other kind of harness, without being limited to battery current lines. For example, it may include three motor current lines, or a plurality of torque sensor signal lines. The thickness of a harness will depend on the type of the harness. For example, current lines may be relatively thick, while torque sensor signal lines may be relatively thin. When a relatively thick harness, e.g., a current line, is caught between the electronic circuit board and the female screw hole, the worker is likely to notice it. Therefore, there is relatively a small chance that the screw will be mistakenly fastened and damage the harness. On the other hand, when a thin harness such as a torque sensor signal line is caught between the electronic circuit board and the female screw hole, the worker is less likely to notice it. Thus, there is a relatively large chance that the screw will be mistakenly fastened and damage the harness. The second guide member 130*b* is able to push not only a relatively thick harness such as battery current lines, but also a relatively thin harness such as torque sensor signal lines, into the housing. Thus, the possibility of damaging the harness is sufficiently reduced.

Although the insertion guide 110*a* doubles as the harness guide 130 in the above preferred embodiments, they may be provided as separate and independent elements.

Thus, preferred embodiments of the drive unit 51 have been described.

By using the above-described holder 100 in order to assemble the drive unit 51, workability is greatly improved. The order of assembly may be as follows, for example. Using the tabs 102*a*, 102*b* and 102*c* of the holder 100, the holder 100 is fixed to the electronic circuit board 200 in such a manner that the holder 100 covers an entirety or a portion of the electronic circuit board 200. Thus, the holder/electronic circuit board 250 is obtained. Next, while pressing on the holder 100 in the holder/electronic circuit board 250, the holder/electronic circuit board 250 is inserted into the separately provided left housing 300L, in such a manner that the electronic circuit board 200 goes in first. Then, in the left housing 300L, the electronic circuit board 200 is accommodated at a deeper position than the holder 100. Moreover, screws are passed into the hole 120*b* in the holder 100 and into the hole 220*b* in the electronic circuit board 200, and furthermore a fastener is passed into the female screw hole 350*b* in the left housing 300L, thus fixing the holder/electronic circuit board 250 to the left housing 300L. As a result, the electronic circuit board 200 is incorporated into the housing 300.

Although the above preferred embodiments assume that the electronic circuit board 200 is preferably C-shaped or substantially C-shaped, this shape is only an example. In other examples, the electronic circuit board may have a circular shape, a semicircular shape, a sector shape, a rectangular shape, or the like. In accordance with the shape of the electronic circuit board, the shape of the holder 100 may also be similarly changed. Then, in each and every holder, two or more tabs to fix the holder and the electronic circuit board may be provided; and in each and every holder, at least one type among an insertion guide, a screw guide, and a harness guide may be provided.

Note that the shape of the holder 100 does not need to be substantially identical or substantially similar to the shape to the electronic circuit board. Even if these are considerably different in shape, it does not matter so long as they are able to be fixed by two or more tabs and at least one type among an insertion guide, a screw guide, and a harness guide is provided.

As one example, insertion guides will be discussed. As described above, insertion guides are to be provided for the purposes of, when fitting the holder/electronic circuit board to the housing, preventing fluctuations in the inserted position, eliminating or reducing rattling of the holder/electronic circuit board 250, and ensuring electrical insulation between the electronic circuit board and the housing. Therefore, the holder shape may be adjusted so that insertion guides are provided in two location, or three or more locations on the holder, and more preferably uniformly along the outer edge of the electronic circuit board. In the case where the electronic circuit board is downsized so that the distance S to the inner wall surface of the housing is relatively large (e.g., several mm or about 1 cm), for example, the shape of the insertion guide may be changed. Specifically, instead of a thin-plate shape, as has been described in the present preferred embodiment, the insertion guides may have a block shape, for example.

An exemplary drive unit according to a preferred embodiment of the present invention is a drive unit 51 for an electrically assisted vehicle 1, wherein the drive unit 51 includes an electric motor 25; an electronic circuit board 200 having mounted thereon a control circuit that controls rotation of the electric motor; a holder 100 covering an entirety or a portion of the electronic circuit board and being fixed to the electronic circuit board; and a housing 300 (300L) accommodating the electric motor, the electronic circuit board, and the holder, such that the electronic circuit board is accommodated at a deeper position than the holder. The electronic circuit board includes first holes 220*a* to 220*d*. The holder includes second holes 120*a* to 120*d* and at least two tabs 102*a* to 102*c*. The holder is fixed in a position on the electronic circuit board by using the at least two tabs. The electronic circuit board and the holder are fixed to the housing by fasteners 150*a* to 150*d* extending through the first holes and the second holes. Providing a holder which is fixed to an electronic circuit board by using at least two tabs allows for easy positioning using fasteners during a mounting task onto the housing, and protects the electronic circuit board after mounting.

According to a preferred embodiment of the present invention, when the holder is fixed to the electronic circuit board using the at least two tabs, the first holes oppose the second holes. Since the first holes in the electronic circuit board oppose the second holes in the holder, the positions of the first holes in the circuit board are easily determined during the mounting task onto the housing. Since the electronic circuit board is protected by the holder, when the fasteners are passed through the first holes in the circuit board, the possibility for the tool mistakenly contacting the electronic circuit elements, wiring lines, etc., on the electronic circuit board is greatly reduced or eliminated.

According to a preferred embodiment of the present invention, the housing preferably includes third holes 350*a* to 350*d*. When the holder is fixed to the electronic circuit board using the at least two tabs and the holder and the electronic circuit board are inserted in the housing, the first holes oppose the third holes. The electronic circuit board is fixed to the housing as a result of the fasteners passing through the first holes and into the third holes. Since the first holes in the circuit board oppose the third holes in the housing, the positions of the first holes in the circuit board are easily determined during the mounting task onto the housing.

According to a preferred embodiment of the present invention, the fasteners are screws, and the third holes are preferably female screw holes. The first holes in the circuit board oppose the second holes in the holder, and also to the third holes in the housing. This allows for a very easy positioning during insertion of the screw.

According to a preferred embodiment of the present invention, the second holes in the holder preferably include recesses 120a, 120c and 120d which are provided along the outer periphery, and, when the holder is fixed to the electronic circuit board using the at least two tabs, a predetermined space is provided between each first hole and the outer periphery where the recesses are located. In the recessed portions of the holder, the electronic circuit board and the housing are fixed by fasteners, e.g., screws.

According to a preferred embodiment of the present invention, the predetermined space is wider than a space that is likely to cause interference between the recesses and heads of the screws.

According to a preferred embodiment of the present invention, the second holes in the holder may be screw guides having a tapered shape. The tapered shape allows each screw to be guided so as to maintain an erect posture, thus making it less likely for the screw to drop. The tapered shape also makes it less likely for the tool being used to mistakenly contact the electronic circuit elements, wiring lines, etc., on the electronic circuit board during insertion of the screw.

According to a preferred embodiment of the present invention, the holder preferably covers regions of the electronic circuit board adjacent the first holes. The holder preferably covers regions adjacent the first holes, where the holder is fastening to the housing. As a result, the electronic circuit board is prevented from being damaged by the tool or the like.

According to a preferred embodiment of the present invention, the holder preferably further includes insertion guides 110a to 110c in at least one location on the outer periphery. Each insertion guide extends along an inner wall of the housing and in a depth direction of the housing. By providing insertion guides, the electronic circuit board and the holder are inserted while being guided along the inner wall of the housing during the mounting task onto the housing.

According to a preferred embodiment of the present invention, an outer edge of the electronic circuit board is preferably spaced apart from an inner wall surface of the housing; and the insertion guides are disposed between the outer edge of the electronic circuit board and the inner wall surface of the housing. Since the electronic circuit board is not in contact with the housing, the electronic circuit board and the housing are electrically insulated from each other.

According to a preferred embodiment of the present invention, the electronic circuit board preferably further includes at least one wiring line 260 which is electrically connected to the electric motor. The holder further includes harness guides 130a and 130b in at least one location on the outer periphery. When the holder is fixed to the electronic circuit board with the at least two tabs and the holder and the electronic circuit board are inserted in the housing, the at least one wiring line is pushed into the housing and maintained in this pushed-into arrangement by the harness guides. Since the wiring line(s) (harness) is maintained in this pushed-into arrangement in the housing by the harness guide during the mounting task onto the housing, the harness is prevented from being caught between the housing and the electronic circuit board.

According to a preferred embodiment of the present invention, the harness guide includes a first guide 130a and a second guide 130b which are connected to each other. The first guide extends along an inner wall of the housing and in a depth direction of the housing. The second guide is connected to the first guide at a predetermined location thereof, and extends in a direction which is perpendicular or substantially perpendicular to the depth direction. With the second guide, the harness guide keeps the at least one wiring line pushed into the housing. Since the second guide of the harness guide includes a surface which extends along directions that are perpendicular or substantially perpendicular to the depth direction of the housing, the wiring line(s) is more reliably pushed into the housing and kept in this pushed-into arrangement in the housing.

According to a preferred embodiment of the present invention, the drive unit further includes a crank shaft 57. The electronic circuit board and the holder are each preferably C-shaped or substantially C-shaped, and surround the crank shaft with the crank shaft being in the center of the C-shape. The second guide of the harness guide extends in a direction which is perpendicular or substantially perpendicular to the depth direction of the housing and which extends toward the crank shaft.

According to a preferred embodiment of the present invention, an electrically assisted vehicle preferably includes a plurality of wheels; any of the above drive units 51; and a motive power transmission (45, 44, 58, 59, 24, 25, 26, 27) to transmit a driving power which is generated by the electric motor of the drive unit to at least one (22) of the plurality of wheels 21 and 22.

According to a preferred embodiment of the present invention, a method of assembling a drive unit 51 for an electrically assisted vehicle 1 includes providing a housing 300 (300L); providing an electronic circuit board 200 having mounted thereon a control circuit that controls rotation of an electric motor 25 that drives the electrically assisted vehicle, the electronic circuit board including first holes 220a to 220d; providing a holder 100 including at least two tabs 102a to 102c and second holes 120a to 120d; by using the at least two tabs to fix the holder to the electronic circuit board so that the holder covers an entirety or a portion of the electronic circuit board; inserting the electronic circuit board into the housing while pressing on the holder so that the electronic circuit board is accommodated at a deeper position than the holder; and fixing the electronic circuit board and the holder to the housing by passing fasteners 150a to 150d through the first holes and the second holes.

After fixing the holder to the electronic circuit board using the at least two tabs, the electronic circuit board is mounted on the housing. This allows for easy positioning using the fasteners during the mounting task onto the housing. After the electronic circuit board is mounted, the electronic circuit board is protected by the holder.

An exemplary method of assembling according to a preferred embodiment of the present invention is useful in assembling a drive unit by fixing an electronic circuit board to a housing.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A drive unit for an electrically assisted vehicle, the drive unit comprising:
   an electric motor;
   an electronic circuit board having mounted thereon a control circuit that controls rotation of the electric motor;
   a holder that covers an entirety or a portion of the electronic circuit board and is fixed to the electronic circuit board; and
   a housing that accommodates the electric motor, the electronic circuit board, and the holder, such that the electronic circuit board is accommodated at a deeper position than the holder; wherein
   the electronic circuit board includes a first hole;
   the holder includes a second hole and at least two tabs;
   a position of the holder on the electronic circuit board is fixed by the at least two tabs; and
   the electronic circuit board and the holder are fixed to the housing by a fastener extending through the first hole and the second hole.

2. The drive unit of claim 1, wherein, when the holder is fixed to the electronic circuit board, the first hole and the second hole oppose each other.

3. The drive unit of claim 2, wherein
   the housing includes a third hole;
   when the holder is fixed to the electronic circuit board and the holder, and the electronic circuit board and the holder are inserted in the housing, the first hole and the third hole oppose each other; and
   the electronic circuit board is fixed to the housing as a result of the fastener passing through the first hole and into the third hole.

4. The drive unit of claim 3, wherein
   the fastener includes a screw; and
   the third hole is a female screw hole.

5. The drive unit of claim 1, wherein
   the second hole in the holder defines a recess along an outer periphery of the holder; and
   when the holder is fixed to the electronic circuit board, a predetermined space is provided between the first hole and the outer periphery where the recess is located.

6. The drive unit of claim 5, wherein the predetermined space is wider than a space that causes interference between the recess and a head of the screw.

7. The drive unit of claim 4, wherein the second hole in the holder includes a screw guide with a tapered shape.

8. The drive unit of claim 1, wherein the holder covers a region of the electronic circuit board in a vicinity of or adjacent to the first hole.

9. The drive unit of claim 1, wherein
   the holder further includes an insertion guide on an outer periphery of the holder; and
   the insertion guide extends along an inner wall of the housing and in a depth direction of the housing.

10. The drive unit of claim 9, wherein
    an outer edge of the electronic circuit board is spaced apart from a surface of the inner wall of the housing; and
    the insertion guide is disposed between the outer edge of the electronic circuit board and the inner wall surface of the housing.

11. The drive unit of claim 1, wherein
    the electronic circuit board further includes at least one wiring line which is electrically connected to the electric motor;
    the holder further includes a harness guide on an outer periphery of the holder; and
    when the holder is fixed to the electronic circuit board and the holder and the electronic circuit board are inserted in the housing, the at least one wiring line is pushed into and maintained in the housing by the harness guide.

12. The drive unit of claim 11, wherein
    the harness guide includes a first guide and a second guide which are connected to each other;
    the first guide extends along an inner wall of the housing and in a depth direction of the housing;
    the second guide is connected to the first guide at a predetermined position thereof, and extends in a direction which is perpendicular or substantially perpendicular to the depth direction; and
    with the second guide, the harness guide keeps the at least one wiring line in the housing.

13. The drive unit of claim 12, further comprising a crank shaft; wherein
    the electronic circuit board and the holder are each C-shaped or substantially C-shaped, and surround the crank shaft with the crank shaft being in a center thereof; and
    the second guide of the harness guide extends in a direction which is perpendicular or substantially perpendicular to the depth direction of the housing and which extends toward the crank shaft.

14. An electrically assisted vehicle comprising:
    a plurality of wheels;
    the drive unit of claim 1; and
    a motive power transmission that transmits a driving power generated by the electric motor of the drive unit to at least one of the plurality of wheels.

15. A method of assembling a drive unit for an electrically assisted vehicle, the method comprising:
    providing a housing;
    providing an electronic circuit board having mounted thereon a control circuit that controls rotation of an electric motor that drives the electrically assisted vehicle, the electronic circuit board including a first hole;
    providing a holder including at least two tabs and a second hole;
    using the at least two tabs to fix a position of the holder on the electronic circuit board so that the holder covers an entirety or a portion of the electronic circuit board;
    inserting the electronic circuit board into the housing while pressing on the holder, so that the electronic circuit board is accommodated at a deeper position than the holder; and
    fixing the electronic circuit board and the holder to the housing by passing a fastener through the first hole and the second hole.

* * * * *